(12) United States Patent
Yu et al.

(10) Patent No.: US 11,935,760 B2
(45) Date of Patent: Mar. 19, 2024

(54) PACKAGE STRUCTURE HAVING THERMAL DISSIPATION STRUCTURE THEREIN AND MANUFACTURING METHOD THEREOF

(71) Applicant: Taiwan Semiconductor Manufacturing Company, Ltd., Hsinchu (TW)

(72) Inventors: Chen-Hua Yu, Hsinchu (TW); Yian-Liang Kuo, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 148 days.

(21) Appl. No.: 17/460,321

(22) Filed: Aug. 30, 2021

(65) Prior Publication Data

US 2023/0068578 A1 Mar. 2, 2023

(51) Int. Cl.
*H01L 23/522* (2006.01)
*H01L 21/48* (2006.01)
(Continued)

(52) U.S. Cl.
CPC .......... *H01L 21/561* (2013.01); *H01L 21/486* (2013.01); *H01L 21/563* (2013.01); *H01L 21/76898* (2013.01); *H01L 23/3114* (2013.01); *H01L 23/5223* (2013.01); *H01L 23/5226* (2013.01); *H01L 23/5383* (2013.01); *H01L 23/642* (2013.01); *H01L 24/05* (2013.01); *H01L 25/0657* (2013.01); *H01L 25/50* (2013.01);
(Continued)

(58) Field of Classification Search
CPC ....... H01L 23/34; H01L 23/36; H01L 23/367; H01L 23/373; H01L 23/3735; H01L 23/3736; H01L 2225/06589; H01L 2224/30519; H01L 2224/33519; H01L 23/5222; H01L 23/5223; H01L 23/642; H01L 28/40; H01L 21/768; H01L 21/76898; H01L 2225/06541; H01L 2225/06548; H01L 21/486; H01L 23/5226; H01L 23/5383; H01L 23/5384; H01L 2224/0233; H01L 2224/02331; H01L 2224/02371; H01L 2224/02372
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Bradley Smith
*Assistant Examiner* — William H Anderson
(74) *Attorney, Agent, or Firm* — JCIPRNET

(57) ABSTRACT

A package structure includes a first thermal dissipation structure, a first semiconductor die, a second semiconductor die. The first thermal dissipation structure includes a semiconductor substrate, conductive vias embedded in the semiconductor substrate, first capacitors electrically connected to the conductive vias, and a thermal transmission structure disposed over the semiconductor substrate and the conductive vias. The first semiconductor die is disposed on the first thermal dissipation structure. The second semiconductor die is disposed on the first semiconductor die opposite to the first thermal dissipation structure.

20 Claims, 30 Drawing Sheets

(51) Int. Cl.
*H01L 21/56* (2006.01)
*H01L 21/768* (2006.01)
*H01L 23/00* (2006.01)
*H01L 23/31* (2006.01)
*H01L 23/538* (2006.01)
*H01L 23/64* (2006.01)
*H01L 25/00* (2006.01)
*H01L 25/065* (2023.01)
*H01L 23/367* (2006.01)
*H01L 23/373* (2006.01)

(52) U.S. Cl.
CPC ........ *H01L 23/367* (2013.01); *H01L 23/3735* (2013.01); *H01L 2224/023* (2013.01); *H01L 2224/05026* (2013.01); *H01L 2224/05552* (2013.01); *H01L 2225/06541* (2013.01); *H01L 2225/06548* (2013.01); *H01L 2225/06589* (2013.01)

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2013/0320493 A1* | 12/2013 | Chang | H01L 21/768 257/532 |
| 2019/0198481 A1* | 6/2019 | Lee | H01L 25/0652 |
| 2020/0091063 A1* | 3/2020 | Chen | H01L 25/0657 |
| 2020/0152608 A1* | 5/2020 | Hu | H01L 23/5389 |
| 2020/0411636 A1* | 12/2020 | Kao | H01L 28/91 |
| 2021/0233849 A1* | 7/2021 | Greco | H01L 23/5222 |
| 2021/0249348 A1* | 8/2021 | Li | H01L 28/60 |
| 2022/0223530 A1* | 7/2022 | Yu | H01L 23/49822 |
| 2023/0060324 A1* | 3/2023 | Liu | H01L 29/66181 |

\* cited by examiner

PACKAGE STRUCTURE HAVING THERMAL DISSIPATION STRUCTURE THEREIN AND MANUFACTURING METHOD THEREOF

BACKGROUND

In the packaging of integrated circuits, semiconductor dies may be stacked through bonding, and may be bonded to other package components such as interposers. The resulting packages are known as Three-Dimensional Integrated Circuits (3DICs). The heat dissipation is a challenge in the 3DICs. There exists a bottleneck regarding how to efficiently dissipate the heat generated in the inner dies of the 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
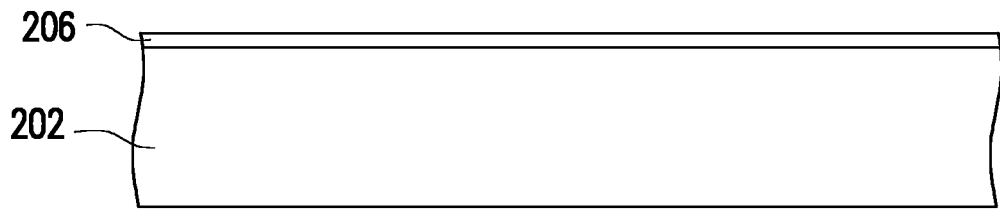
FIG. 1A to FIG. 1R are schematic cross-sectional views illustrating various stages of a manufacturing method of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
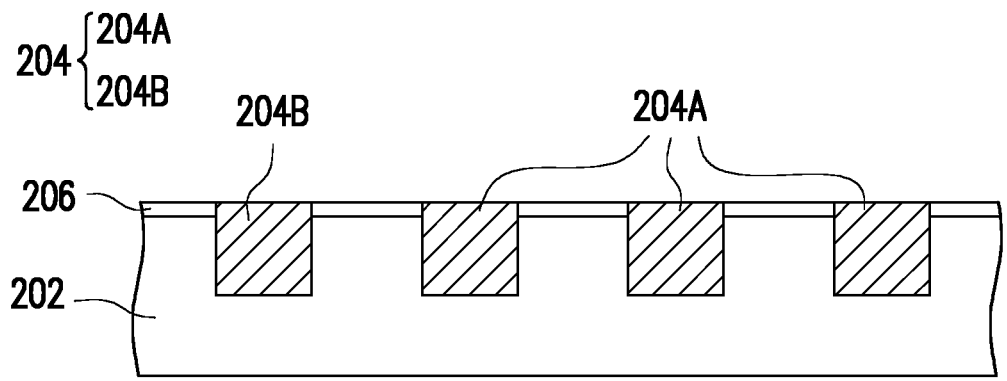
Figure 1C:
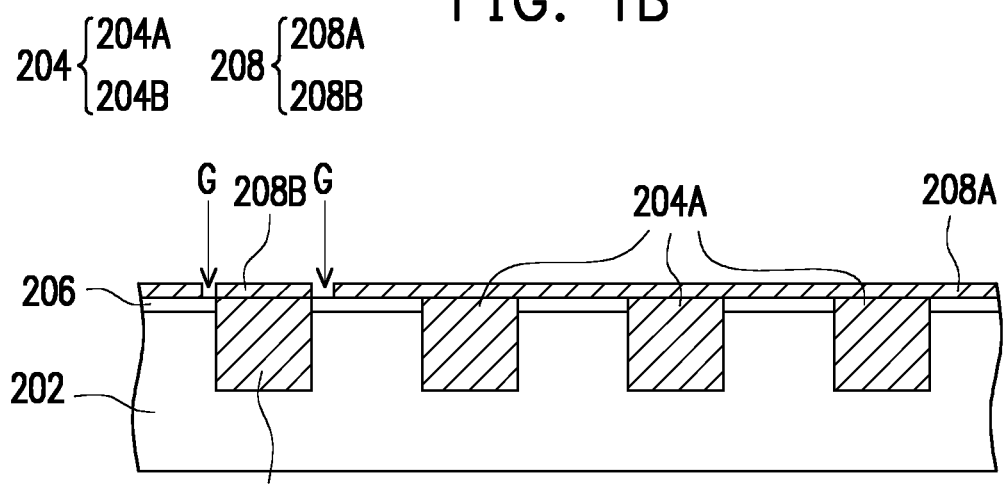
Figure 1D:
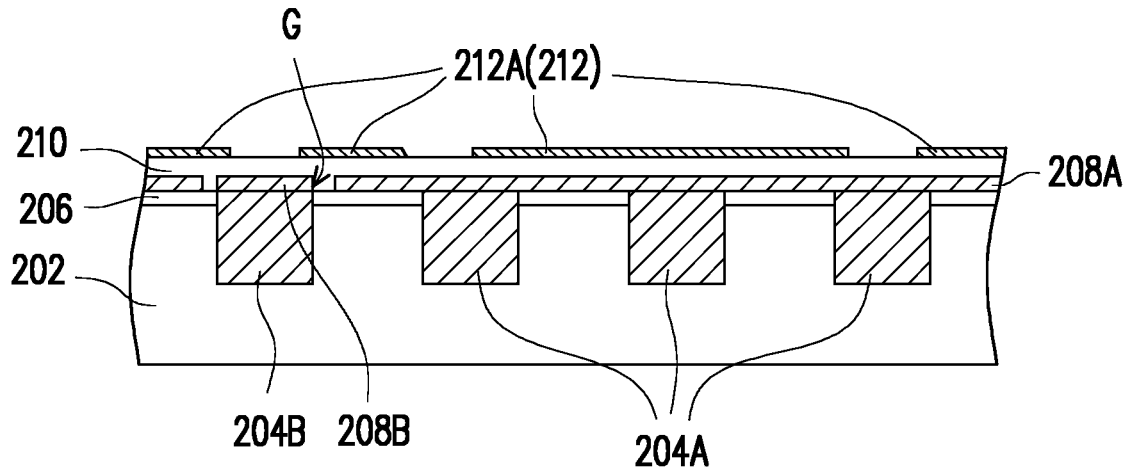
Figure 1E:
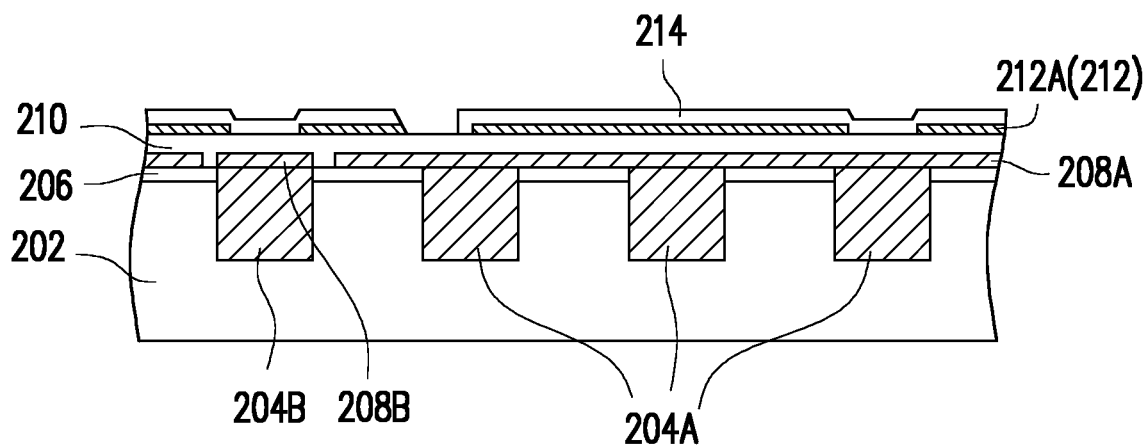
Figure 1F:
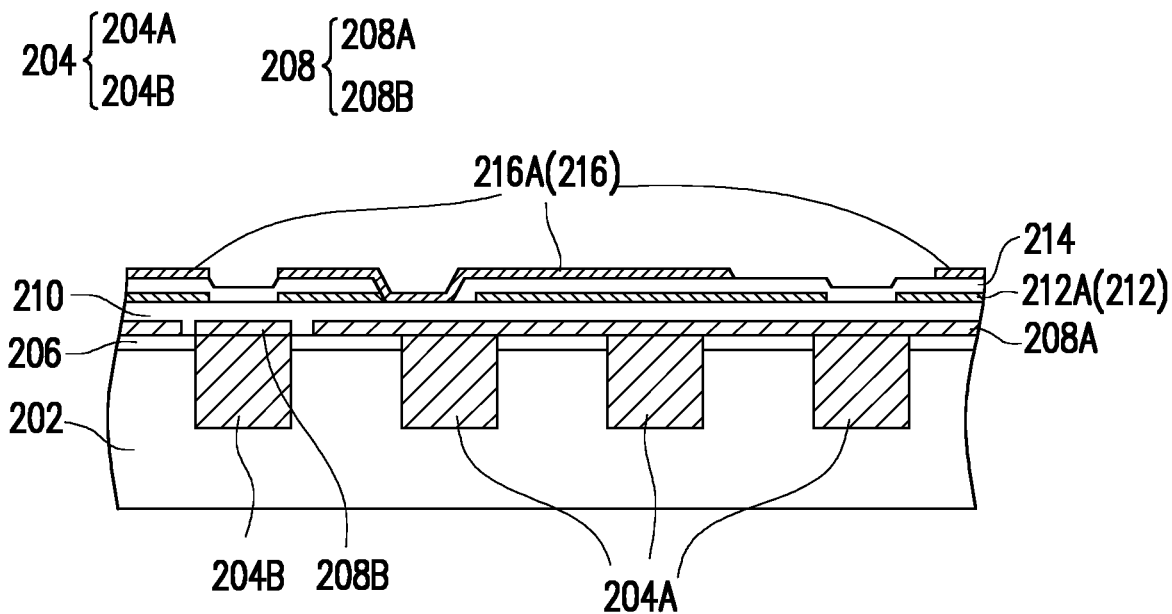
Figure 1G:
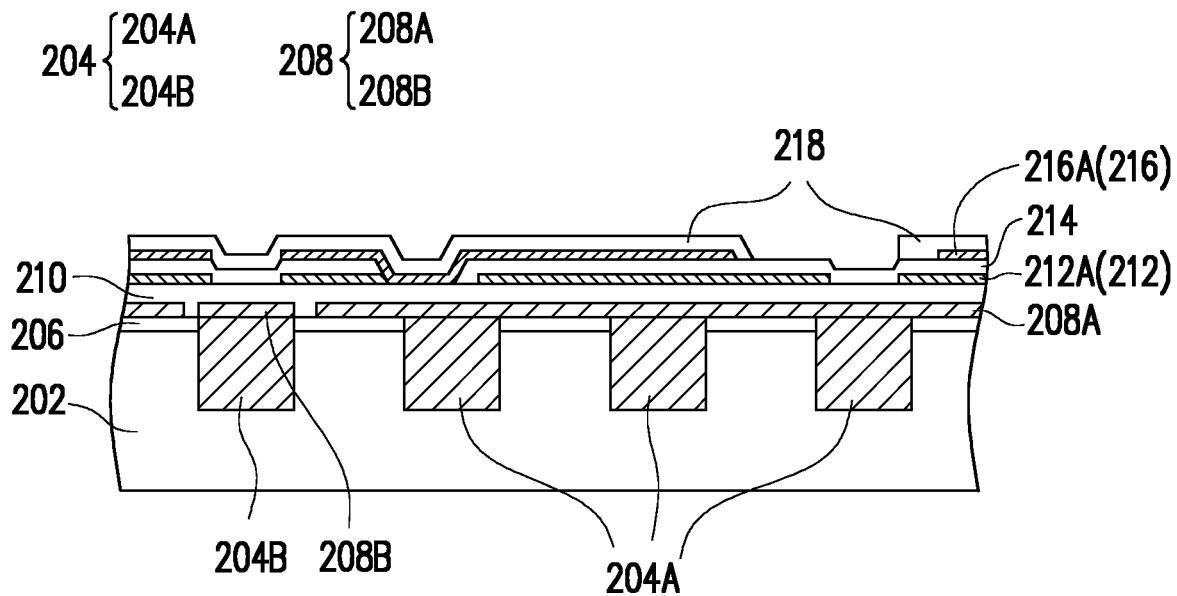
Figure 1H:
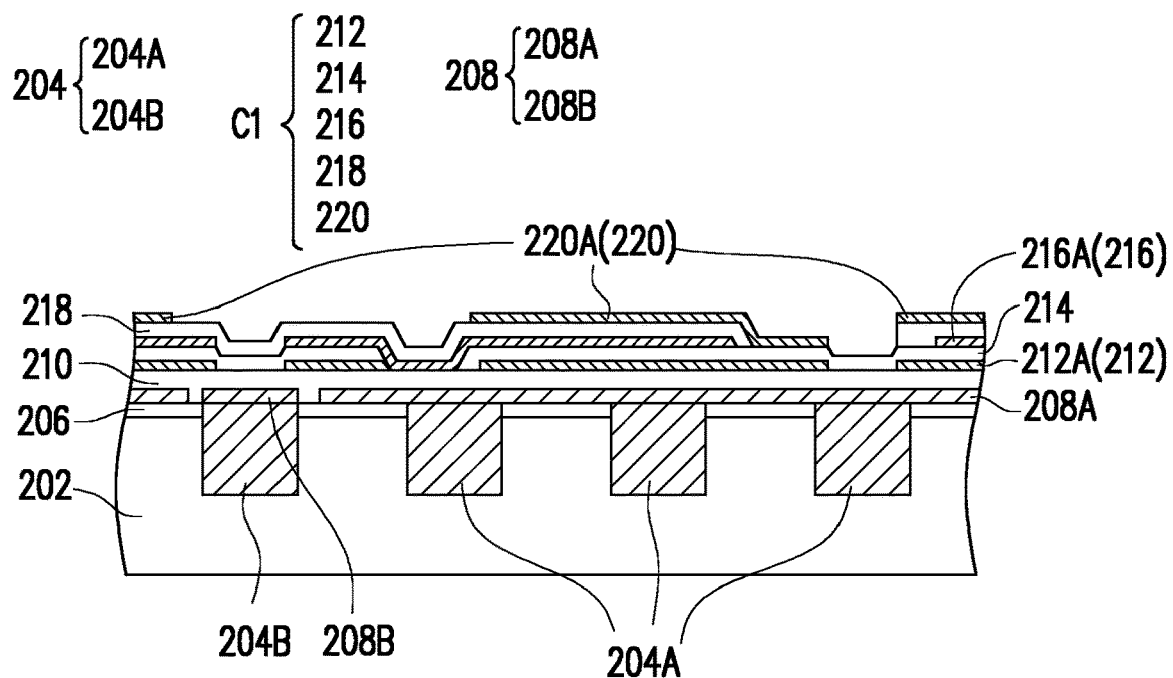
Figure 1I:
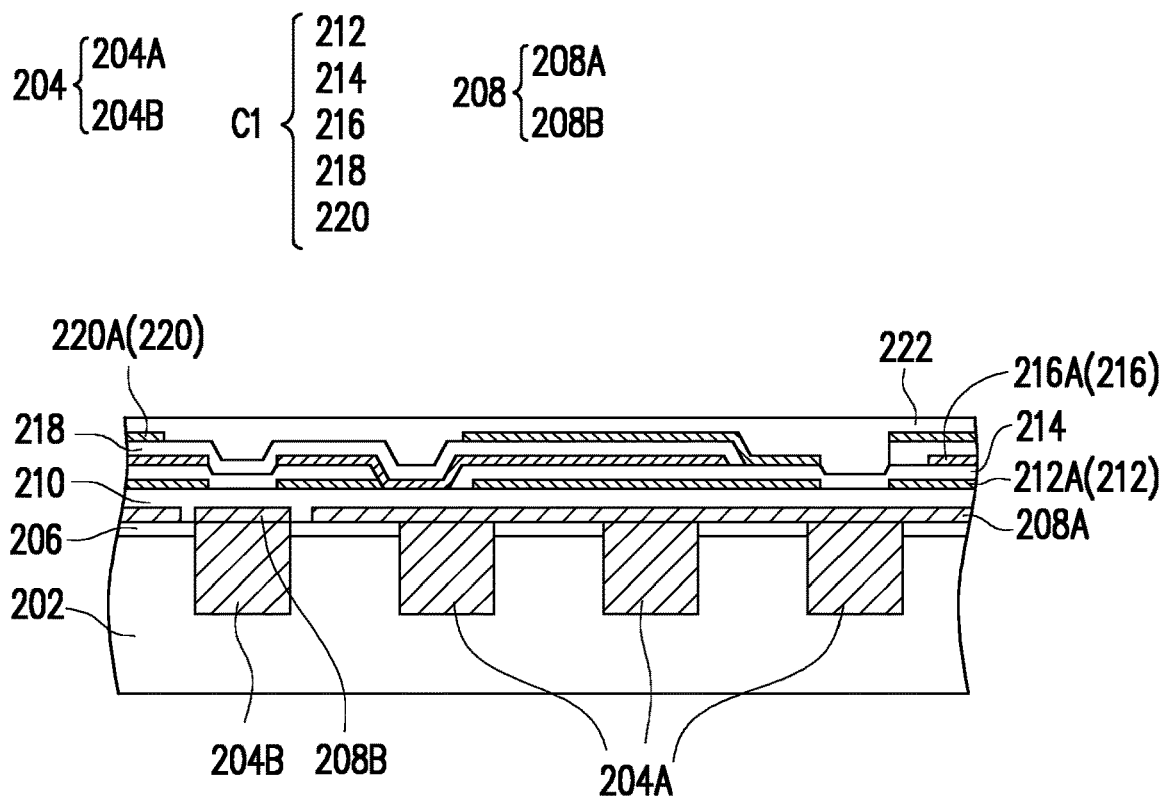
Figure 1J:
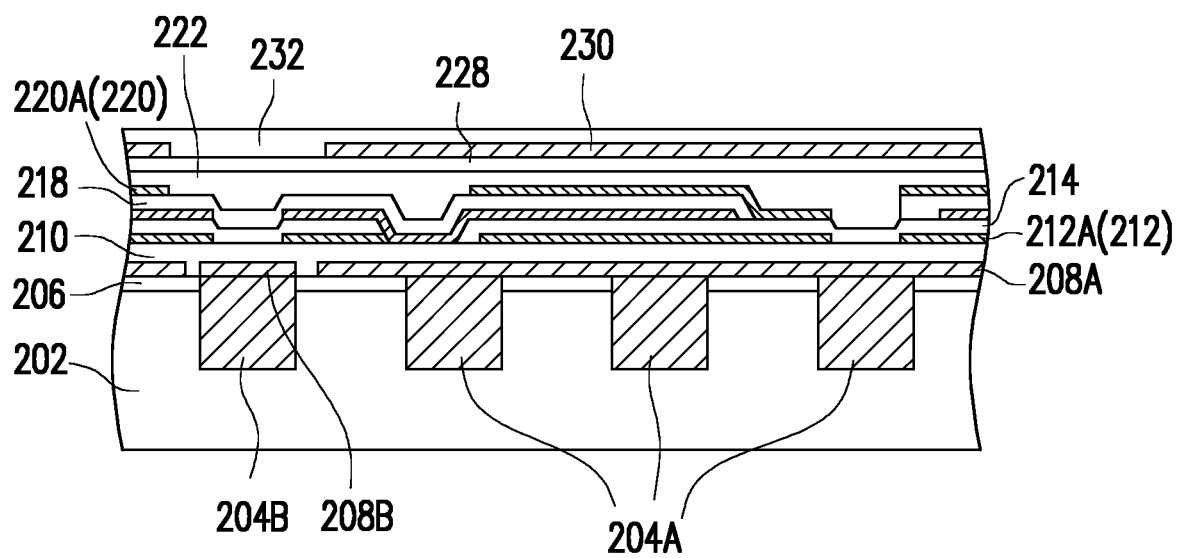
Figure 1K:
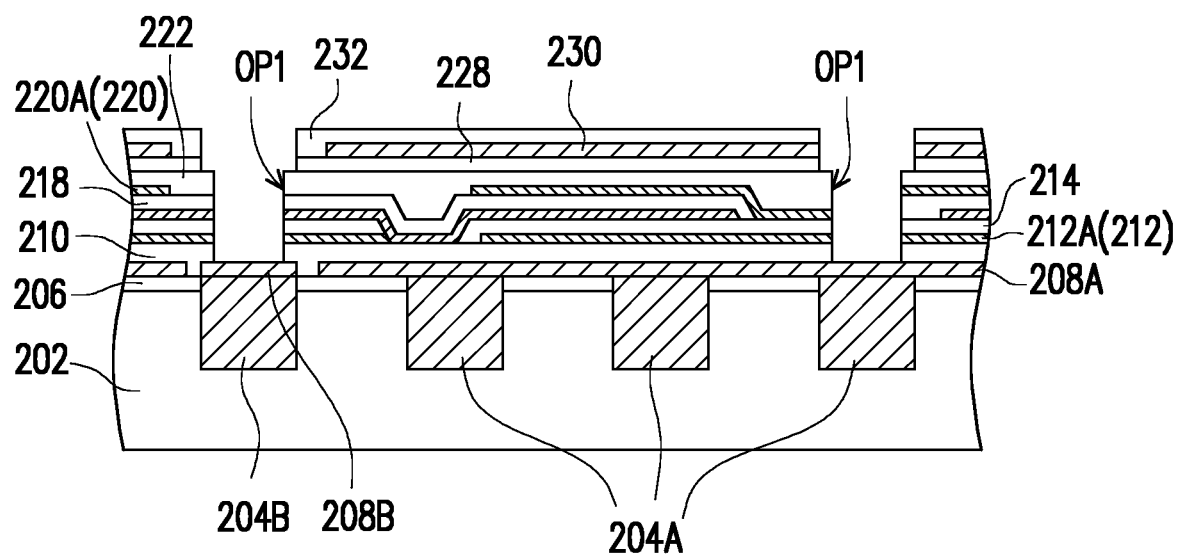
Figure 1L:
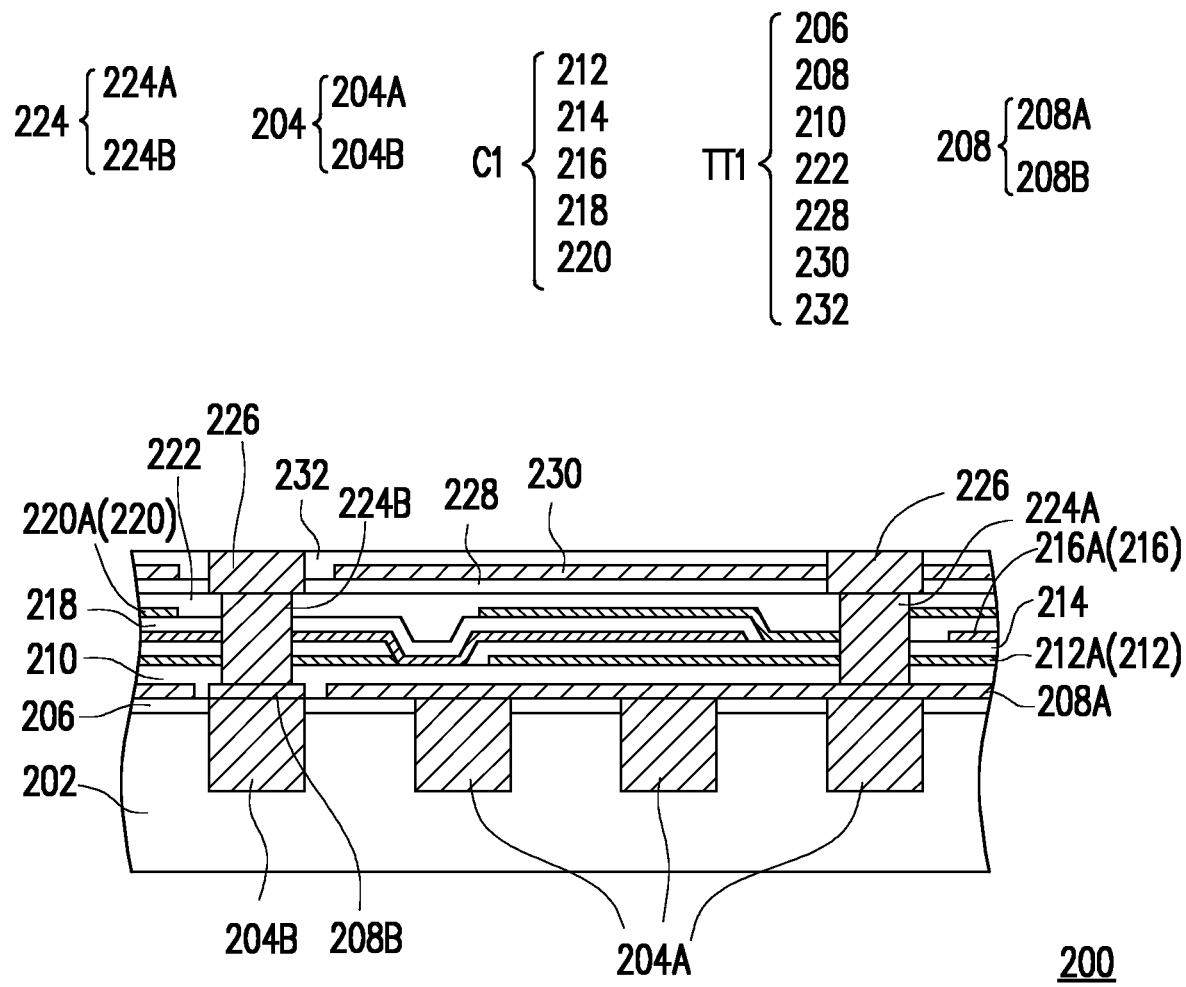
Figure 1M:
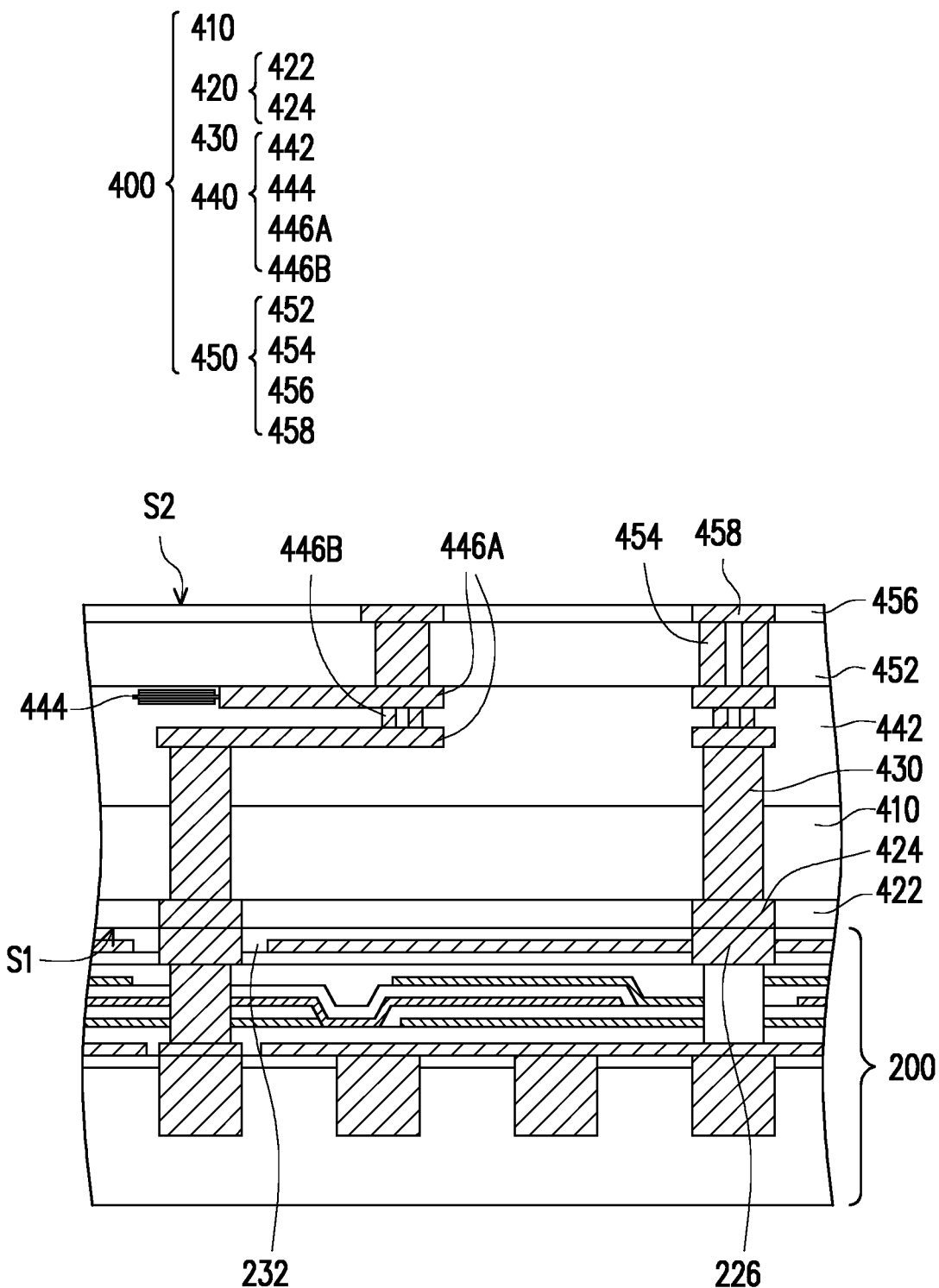
Figure 1N:
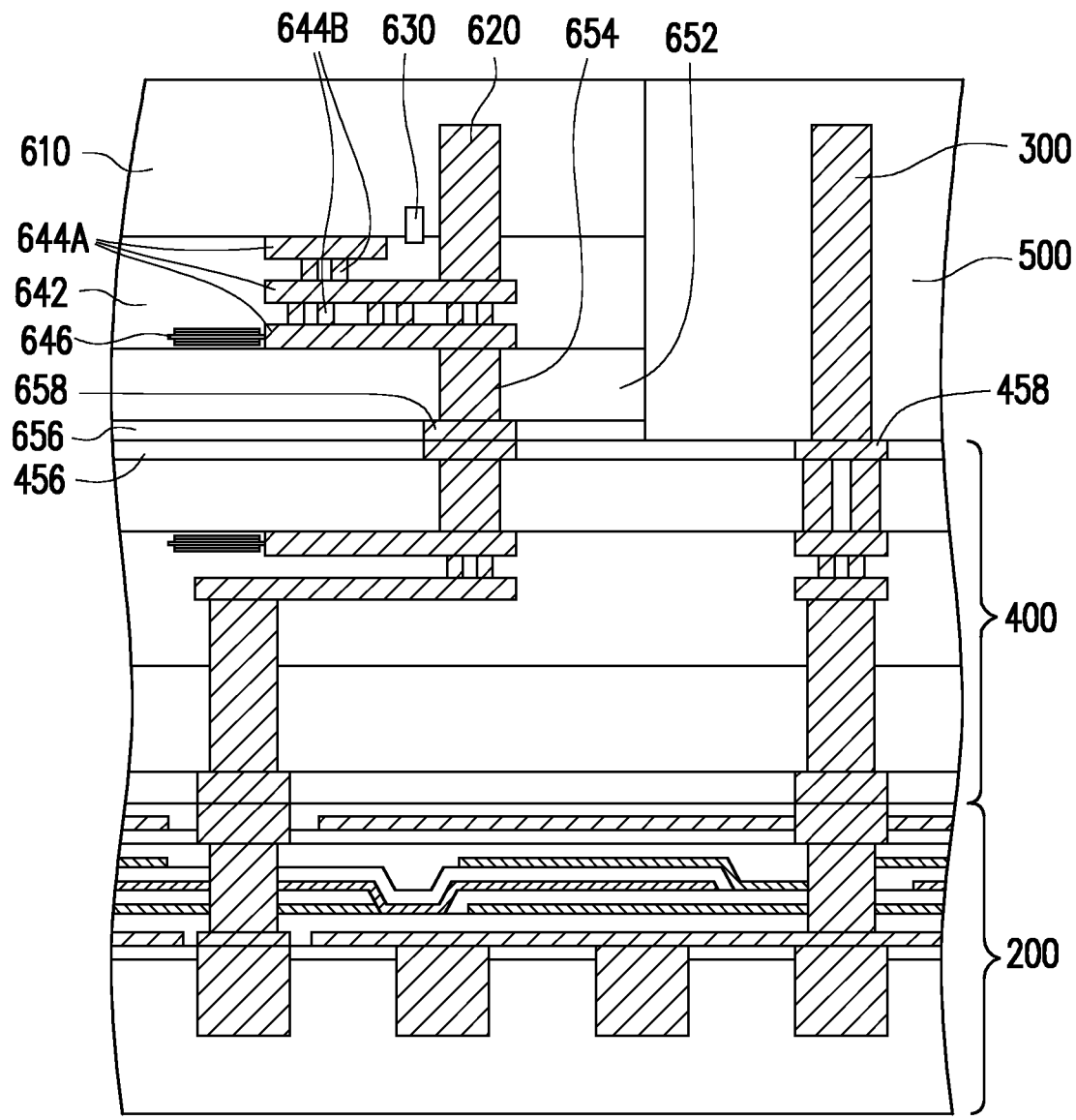
Figure 10:
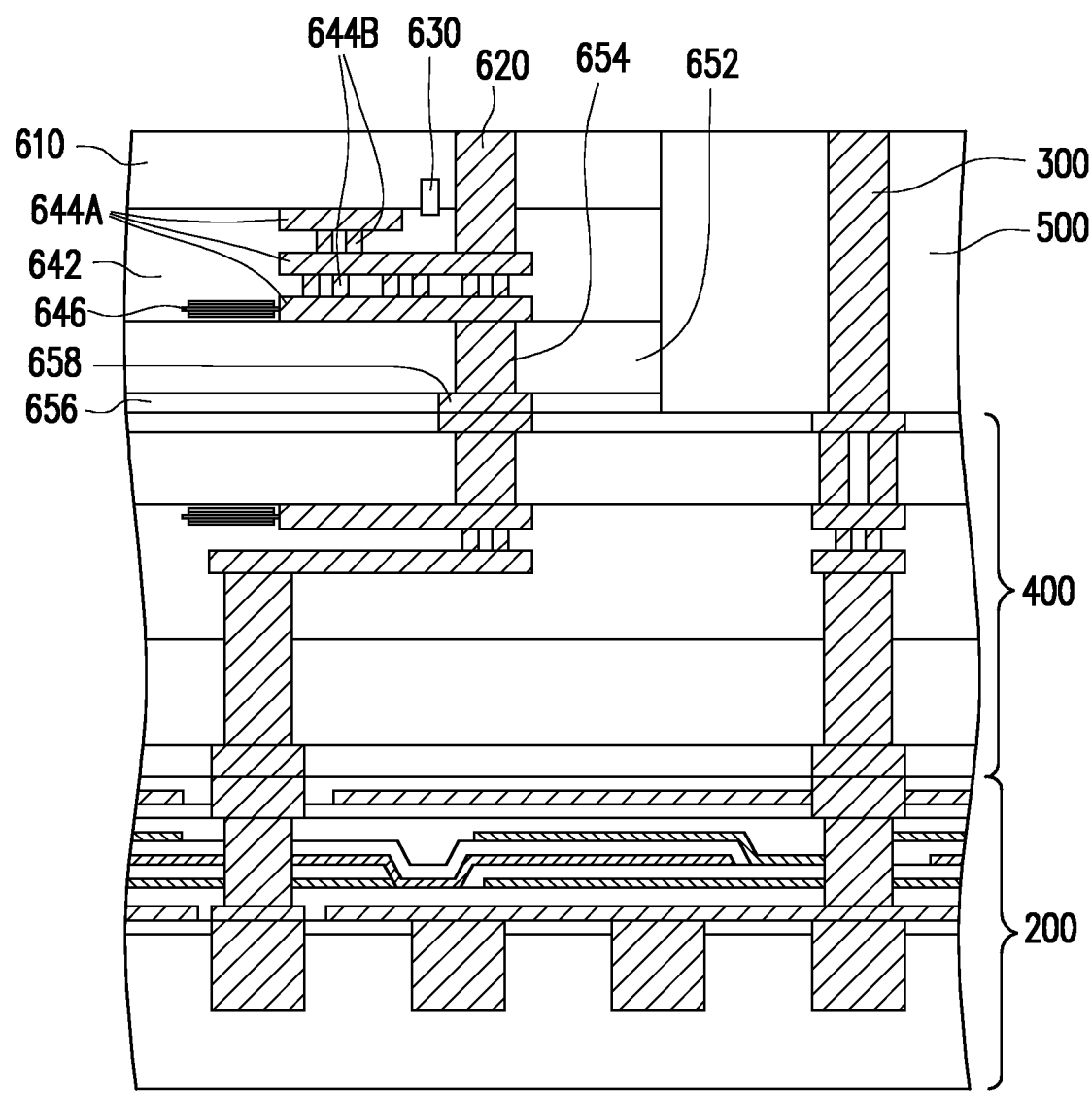
Figure 1P:
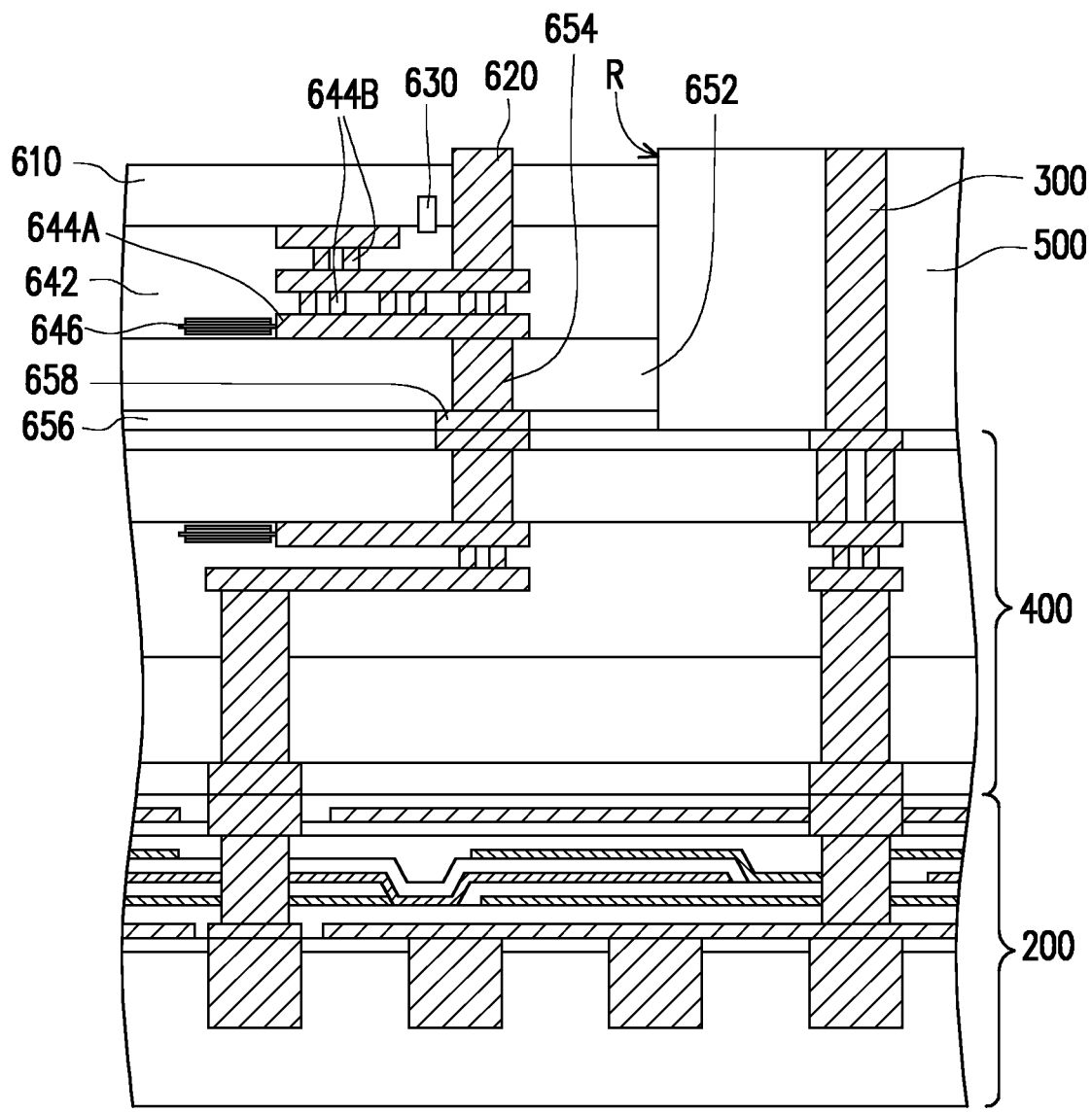
Figure 1Q:
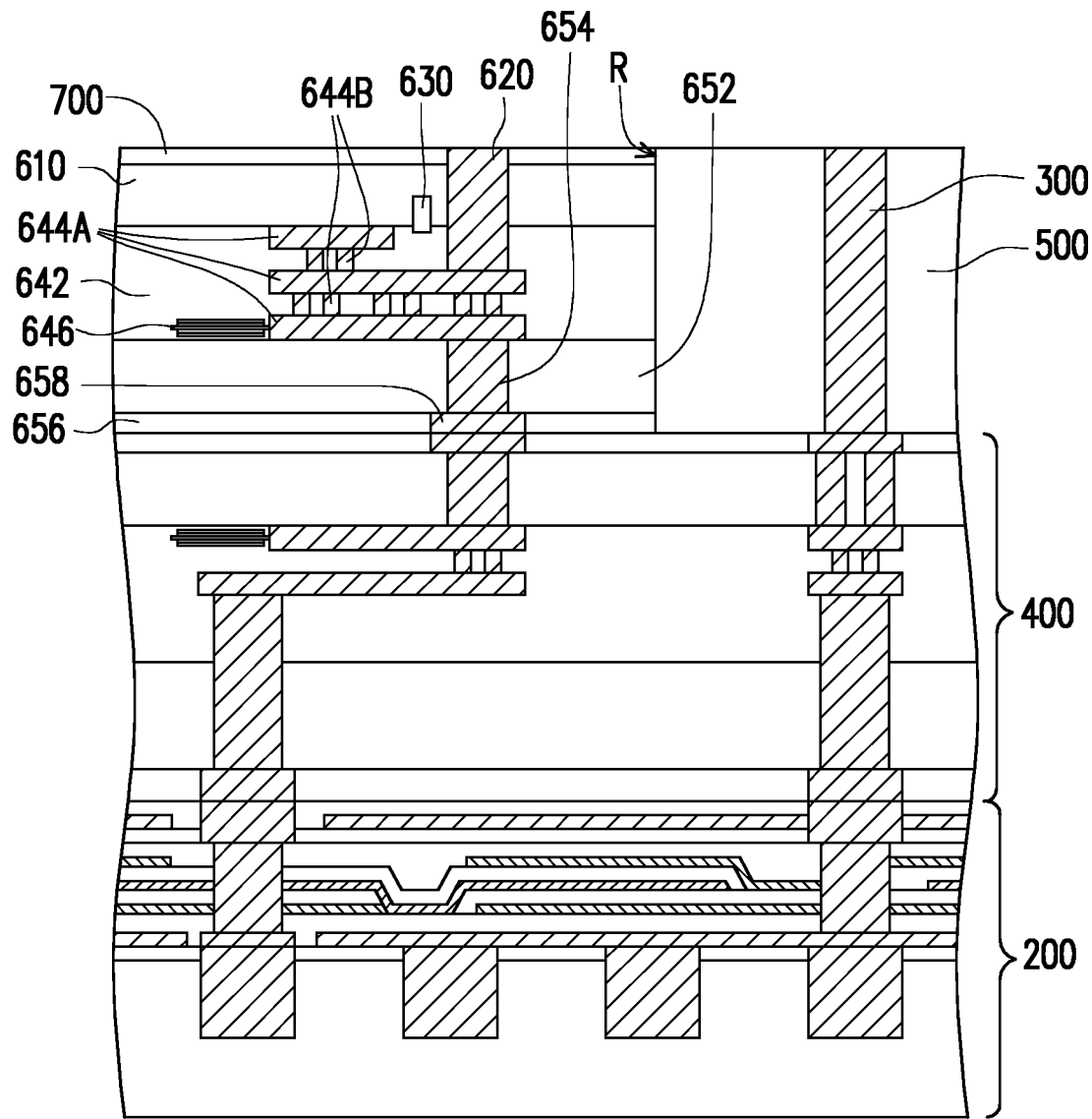
Figure 1R:
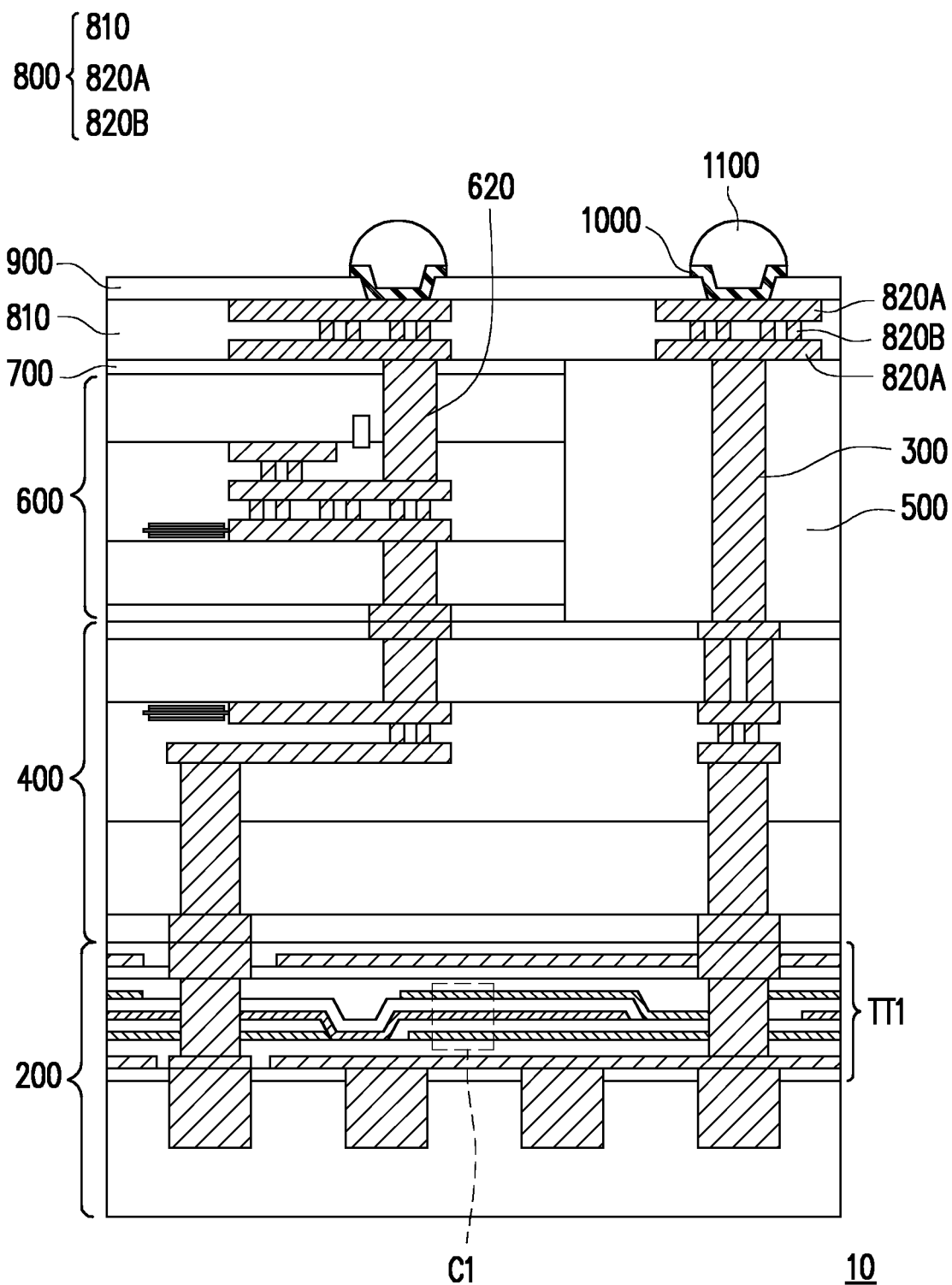

FIG. 1A to FIG. 1R are schematic cross-sectional views illustrating various stages of a manufacturing method of a package structure 10 in accordance with some embodiments of the disclosure. Referring to FIG. 1A, a semiconductor substrate 202 is provided. The semiconductor substrate 202 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The semiconductor substrate 202 may be a bulk silicon substrate, a silicon-on-insulator (SOI) substrate, or a germanium-on-insulator (GOI) substrate. In some embodiments, the semiconductor substrate 202 is free of active components (e.g., transistors or the like) and passive components (e.g., resistors, capacitors, inductors, or the like).

As illustrated in FIG. 1A, a dielectric layer 206 is formed over the semiconductor substrate 202. For example, the dielectric layer 206 completely covers a top surface of the semiconductor substrate 202. In some embodiments, the dielectric layer 206 may be formed by suitable fabrication techniques, such as vapor deposition, spin coating, atomic layer deposition (ALD), thermal oxidation, some other suitable deposition or growth process, or a combination thereof. The vapor deposition may include, for example, chemical vapor deposition (CVD), physical vapor deposition (PVD), plasma enhanced chemical vapor deposition (PECVD), some other suitable vapor deposition process, or a combination thereof. In some embodiments, materials of the dielectric layer 206 includes polyimide, polybenzoxazole (PBO), benzocyclobutene (BCB), a nitride such as silicon nitride, an oxide such as silicon oxide, undoped silicate glass (USG), phosphosilicate glass (PSG), borosilicate glass (BSG), boron-doped phosphosilicate glass (BPSG), a combination thereof, or the like.

Referring to FIG. 1B, a plurality of conductive vias 204 is formed. In some embodiments, the conductive vias 204 are embedded in the semiconductor substrate 202 and the dielectric layer 206. For example, a top surface of each conductive via 204 is coplanar with a top surface of the dielectric layer 206. In some embodiments, the conductive vias 204 are vertically embedded, and each conductive via 204 is spaced apart from the adjacent conductive vias 204 by the semiconductor substrate 202 and the dielectric layer 206. For example, the dielectric layer 206 is in physical contact with a portion of each sidewall of the conductive vias 204. In some embodiments, the conductive vias 204 include a plurality of first conductive via 204A and a second conductive vias 204B. In other words, the first conductive vias 204A and the second conductive via 204B are embedded in the semiconductor substrate 202 and the dielectric layer 206. In some embodiments, the first conductive vias 204A are used for conducting common ground terminal voltage VSS, and hence are alternatively referred to as "VSS vias." On the other hand, the second conductive via 204B is used for conducting device operation voltage VDD, and hence is alternatively referred to as "VDD via." In other words, the first conductive vias 204A are electrically connected to a ground voltage and the second conductive via 204B is electrically connected to a voltage different from the ground voltage. For simplicity, three first conductive vias 204A and one second conductive via 204B are shown. However, it should be understood that the number of the first conductive vias 204A and the second conductive via 204B may vary based on demand. For example, there may be equal numbers of first conductive vias 204A and second conductive via 204B or there may be more second conductive via 204B than first conductive vias 204A.

In some embodiments, each conductive via 204 includes at least one barrier material (not shown) and at least one conductive material. The barrier material includes, for example, titanium, titanium-nitride, tantalum, tantalum-nitride, other barrier materials, and/or combinations thereof. The conductive material includes, for example, aluminum, copper, aluminum-copper, titanium, nickel, tungsten, other conductive materials, and/or combinations thereof. In some embodiments, the barrier material is located between the conductive material and the semiconductor substrate 202 to avoid undesired diffusion of atoms. In some embodiments, the conductive vias 204 are formed using an Electro-Chemical Plating (ECP) process, although other plating methods may be used. It should be noted that although FIG. 1A to FIG. 1B illustrated that the dielectric layer 206 is formed prior to the formation of the conductive vias 204, the disclosure is not limited thereto. In some alternative embodiments, the conductive vias 204 are partially embedded in the semiconductor substrate 202 with a portion protruding from the top surface of the semiconductor substrate 202 before the dielectric layer 206 is formed to fill the spaces between the protruding portions of the conductive vias 204.

Referring to FIG. 1C, a conductive plane 208 is formed on the dielectric layer 206 and the conductive vias 204. For example, the dielectric layer 206 is disposed between the semiconductor substrate 202 and the conductive plane 208. In some embodiments, the conductive plane 208 includes a first portion 208A and a second portion 208B electrically and physically isolated from the first portion 208A. For example, a gap G exists between the first portion 208A and the second portion 208B of the conductive plane 208 to partially expose the underlying dielectric layer 206, and the gap G will be filled by subsequent deposited layers. As illustrated in FIG. 1C, the first portion 208A of the conductive plane 208 covers the first conductive vias 204A and the second portion 208b of the conductive plane 208 covers the second conductive via 204B. In some embodiments, a material of the conductive plane 208 includes aluminum, titanium, copper, nickel, tungsten, and/or alloys thereof. The conductive plane 208 may be formed by, for example, electroplating, deposition, and/or photolithography and etching.

Referring to FIG. 1D, a dielectric layer 210 and a conductive layer 212 are sequentially formed on the dielectric layer 206 and the conductive plane 208. For example, the dielectric layer 210 is formed to cover the conductive plane 208. Meanwhile, the dielectric layer 210 also fills into the gap G to cover the exposed portion of the dielectric layer 206. In some embodiments, a material and a formation method of the dielectric layer 210 are similar to those of the dielectric layer 206, so the detailed descriptions thereof are omitted herein.

In some embodiments, the conductive layer 212 is formed on a top surface of the dielectric layer 210. The conductive layer 212 may be a single-layer structure or a multi-layer structure. In some embodiments, the conductive layer 212 includes various conductive materials, such as a metal, a metal alloy, a metal nitride, a metal silicide, a metal oxide, graphene, or a combination thereof. For example, the conductive layer 212 may include aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or a combination thereof.

In some embodiments, the conductive layer 212 includes a plurality of conductive patterns 212A spaced apart from one another. The conductive patterns 212A may be formed by the following process. First, a conductive material layer (not shown) is conformally formed on the dielectric layer 210 by a suitable technique such as a PVD process. Thereafter, the conductive material layer is patterned by photolithography and etching processes to form the conductive patterns 212A. As illustrated in FIG. 1D, the conductive patterns 212A are formed over the conductive plane 208, the first conductive vias 204A, and the second conductive vias 204B.

Referring to FIG. 1E, an insulating layer 214 is formed over the conductive layer 212 and the dielectric layer 210. For example, the insulating layer 214 is formed to cover the conductive patterns 212A. In some embodiments, the insulating layer 214 is conformal with the conductive layer 212. In some embodiments, the insulating layer 214 is divided into two isolated portions, as shown in FIG. 1E. As illustrated in FIG. 1E, one portion of the insulating layer 214 overlaps and covers both sidewalls of some of the conductive patterns 212A, while another portion of the insulating layer 214 exposes one sidewall of at least one of the remaining conductive patterns 212A. For example, after the formation of the insulating layer 214, one sidewall of one of the conductive patterns 212A is still partially exposed. However, the disclosure is not limited thereto. In some alternative embodiments, the insulating layer 214 is one continuous layer.

In some embodiments, the insulating layer 214 is formed by, for example, a CVD process, spin coating process, an atomic layer deposition (ALD) process. In some embodiments, a material of the insulating layer 214 includes oxide, nitride, oxynitride, a high-k dielectric material or a combination thereof. The insulating layer 214 includes, for example, silicon oxide, silicon nitride, silicon oxynitride, an oxide-nitride-oxide (ONO) structure, a high-k dielectric material having a dielectric constant greater than that of silicon oxide, or a combination thereof. In some embodiments, the dielectric constant of the high-k dielectric material is greater than 4, greater than 7 or even greater than 10. The high-k dielectric material may include hafnium oxide ($HfO_2$), hafnium silicate ($HfSiO_4$), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), titanium oxide ($TiO_2$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT) or a combination thereof.

Referring to FIG. 1F, a conductive layer 216 is formed over the insulating layer 214. In some embodiments, a formation method and a material of the conductive layer 216 are similar to those of the conductive layer 212, so the detailed descriptions thereof are omitted herein. In some embodiments, the conductive layer 216 includes a plurality of conductive patterns 216A electrically isolated from one another. For example, the conductive patterns 216A are formed on insulating layer 214, and the underlying insulating layer 214 is partially exposed by spaces between adjacent conductive patterns 216A. In some embodiments, the conductive patterns 216A are formed such that the insulating layer 214 is sandwiched between the conductive patterns 216A and the conductive patterns 212A. In some embodiments, at least one of the conductive patterns 216A includes a step structure to electrically connect to the underlying conductive patterns 212A. However, the disclosure is not limited thereto. In some alternative embodiments, the conductive layer 216 is electrically isolated from the conductive layer 212.

Referring to FIG. 1G, an insulating layer 218 is formed over the conductive layer 216 and the insulating layer 214. For example, the insulating layer 218 is formed to cover the conductive patterns 216A. In some embodiments, a formation method and a material of the insulating layer 218 is similar to those of the insulating layer 214, so the detailed descriptions thereof are omitted herein. In some embodiments, the insulating layer 218 is conformal with the conductive layer 216. Similar to that of the insulating layer 214, the insulating layer 218 may be divided into multiple isolated portions or may be a continuous layer. As illustrated in FIG. 1G, after the formation of the insulating layer 218, the conductive patterns 216A are being completely covered.

Referring to FIG. 1H, a conductive layer 220 is formed over the insulating layer 218. In some embodiments, a formation method and a material of the conductive layer 220 are similar to those of the conductive layer 212, so the detailed descriptions thereof are omitted herein. In some embodiments, the conductive layer 220 includes a plurality of conductive patterns 220A electrically isolated from one another. For example, the conductive patterns 220A are formed on insulating layer 218, and the underlying insulating layer 214 and the underlying insulating layer 218 are partially exposed by spaces between adjacent conductive patterns 220A. In some embodiments, the conductive patterns 220A are formed such that the insulating layer 218 is sandwiched between the conductive patterns 220A and the conductive patterns 216A. In some embodiments, at least one of the conductive patterns 220A includes a step structure. In some embodiments, the conductive layer 220 is electrically isolated from the conductive layer 212 and the conductive layer 216. However, the disclosure is not limited thereto. In some alternative embodiments, the conductive layer 220 may be electrically connected to the conductive layer 212 and/or the conductive layer 216 through the step structure. In some embodiments, the conductive layer 212, the insulating layer 214, the conductive layer 216, the insulating layer 218, and the conductive layer 220 forms a plurality of capacitors C1. For example, the conductive patterns 212A, the corresponding insulating layer 214, the corresponding conductive patterns 216A, the corresponding insulating layer 218, and the corresponding conductive patterns 220A collectively form one of the capacitors C1. In some embodiments, since the conductive layer 212, the insulating layer 214, the conductive layer 216, the insulating layer 218, and the conductive layer 220 are stacked in metal-insulator-metal-insulator-metal manner, the capacitors C1 are referred to as "metal-insulator-metal (MIM)" capacitors.

Referring to FIG. 1I, a dielectric layer 222 is formed over the conductive layer 220. In some embodiments, a formation method and a material of the dielectric layer 222 are similar to those of the dielectric layer 210, so the detailed descriptions thereof are omitted herein. As illustrated in FIG. 1I, the dielectric layer 222 is formed to cover the conductive layer 220, the insulating layer 218, and the insulating layer 214.

Referring to FIG. 1J, a dielectric layer 228, a conductive plane 230, and a dielectric layer 232 are sequentially formed on the dielectric layer 222. In some embodiments, a formation method and a material of the dielectric layer 228, the conductive plane 230, and the dielectric layer 232 are respectively similar to those of the dielectric layer 206, the conductive plane 208, and the dielectric layer 210, so the detailed descriptions thereof are omitted herein. In some embodiments, the conductive plane 230 is formed to sandwich between the dielectric layer 232 and the dielectric layer 228. In some embodiments, a gap exists between two electrically and physically isolated portions of the conductive plane 230 and the dielectric layer 232 fills the gap between these two portions of the conductive plane 230.

In some embodiments, the dielectric layer 206, the conductive plane 208, the dielectric layer 210, the dielectric layer 222, the dielectric layer 228, the conductive plane 230 and the dielectric layer 232 may serve as a thermal transmission path for the subsequently formed package structure, so these elements are collectively referred to as a thermal transmission structure TT1.

Referring to FIG. 1K, a portion of the dielectric layer 210, a portion of the insulating layer 214, a portion of the insulating layer 218, a portion of the dielectric layer 222, a portion of the dielectric layer 228, a portion of the conductive plane 230, and a portion of the dielectric layer 232 are removed to form a plurality of openings OP1. For example, the dielectric layer 210, the insulating layer 214, the insulating layer 218, the dielectric layer 222, the dielectric layer 228, the conductive plane 230, and the dielectric layer 232 are patterned by a patterning process to form the openings OP1. The patterning process includes photolithography and one or more etching processes, for example. In some embodiments, the patterning process includes a dual-damascene patterning process, so each opening OP1 has a via portion connected to a trench portion. In some embodiments, the openings OP1 penetrate through the dielectric layer 232, the conductive plane 230, the dielectric layer 228, the dielectric layer 222, the insulating layer 218, the insulating layer 214, and the dielectric layer 210 to expose the underlying conductive plane 208. For example, the trench portions of the openings OP1 penetrate through the dielectric layer 232, the conductive plane 230, and the dielectric layer 228 while the via portions of the openings OP1 penetrate through the dielectric layer 222, the insulating layer 218, the insulating layer 214, and the dielectric layer 210. In some embodiments, the openings OP1 expose a portion of the first portion 208A of the conductive plane 208 and a portion of the second portion 208B of the conductive plane 208.

Referring to FIG. 1L, a plurality of bonding vias 224 and a plurality of bonding pads 226 are formed. In some embodiments, a conductive material (not shown) is filled into the via portions of the openings OP1 to form the bonding vias 224. Thereafter, the bonding pads 226 are formed on the exposed bonding vias 224 (i.e. formed in the trench portion of the openings OP1). In some embodiments, a width of each bonding pad 226 is greater than a width of each underlying bonding via 224. In some embodiments, the bonding vias 224 and the bonding pads 226 include the same material. For example, the bonding vias 224 and the bonding pads 226 may be made of aluminum, titanium, copper, nickel, tungsten, or alloys thereof.

As illustrated in FIG. 1L, the bonding vias 224 fill the via portions of the openings OP1 to be in physical contact with the conductive plane 208. In other words, the bonding vias 224 are electrically connected to the conductive vias 204 through the conductive plane 208. In some embodiments, top surfaces of the bonding vias 224 are coplanar with a top surface of the dielectric layer 222. In some embodiments, the bonding pads 226 are formed over the bonding vias 224 such that the bonding vias 224 are located between the bonding pads 226 and the conductive vias 204. For example, the bonding pads 226 are formed such that the bonding vias 224 are sandwiched between the bonding pads 226 and the conductive plane 208. In some embodiments, the bonding pads 226 completely cover the top surface of the bonding vias 224 and cover a portion of the top surface of the dielectric layer 222. In some embodiments, the dielectric layer 228 covers the top surface of the dielectric layer 222 and is adjacent to the bonding pads 226. For example, the dielectric layer 228 is in physical contact with sidewalls of the bonding pads 226.

In some embodiments, the bonding vias 224 include a first bonding via 224A and a second bonding via 224B. As illustrated in FIG. 1L, the first bonding via 224A is disposed on the first portion 208A of the conductive plane 208 while the second bonding via 224B is disposed on the second portion 208B of the conductive plane 208. In other words, the first bonding via 224A is electrically connected to the first conductive via 204A through the first portion 208A of the conductive plane 208 while the second bonding via 224B is electrically connected to the second conductive via 204B through the second portion 208B of the conductive plane 208. In some embodiments, the first bonding via 224A is electrically isolated from the second bonding via 224B. As mentioned above, the first conductive vias 204A are electrically connected to a ground voltage and the second conductive via 204B is electrically connected to a voltage different from the ground voltage. As such, the first bonding via 224A is electrically connected to the ground voltage and the second bonding via 224B is electrically connected to the voltage different from the ground voltage.

As illustrated in FIG. 1L, the capacitors C1 are located aside of the bonding vias 224 and are in physical contact with sidewalls of the bonding vias 224. In other words, the capacitors C1 are electrically connected to the bonding vias 224. In some embodiments, since the bonding vias 224 are electrically connected to the conductive vias 204, the capacitors C1 are also electrically connected to the conductive vias 204 through the conductive plane 208 and the bonding vias 224. In some embodiments, some of the conductive patterns 212A and the conductive patterns 220A are in physical contact with sidewalls of the first bonding via 224A. In other words, some of the conductive patterns 212A and the conductive patterns 220A are physically and electrically connected to the first bonding via 224A. Meanwhile, the conductive patterns 216A are in physical contact with sidewalls of the second bonding via 224B. In other words, the conductive patterns 216A are physically and electrically connected to the second bonding via 224B. As mentioned above, the first bonding via 224A is electrically connected to the ground voltage and the second bonding via 224B is electrically connected to the voltage different from the ground voltage. As such, some of the conductive patterns 212A and the conductive patterns 220A are electrically connected to the ground voltage and the conductive patterns 216A are electrically connected to the voltage different from the ground voltage.

In some embodiments, the dielectric layer 228, the conductive plane 230, and the dielectric layer 232 are located between adjacent bonding pads 226. For example, the conductive plane 230 is in physical contact with sidewalls of some of the bonding pads 226 while being physically isolated from the remaining bonding pads 226. As illustrated in FIG. 1L, the conductive plane 230 is electrically connected to the first conductive vias 204A through the bonding pads 226, the bonding via 224A, and the first portion 208A of the conductive plane 208, but is electrically isolated from the second conductive via 204B. In some embodiments, a gap between the bonding pads 226 and the conductive plane 230 is filled by the dielectric layer 232. In some embodiments, the dielectric layer 232 is in physical contact with the sidewalls of the bonding pads 226.

In some embodiments, the structure illustrated in FIG. 1L may serve as a thermal dissipation mechanism for the subsequently formed package structure, so the structure illustrated in FIG. 1L is referred to as a thermal dissipation structure 200. As illustrated in FIG. 1L, the thermal dissipation structure 200 includes the semiconductor substrate 202, the conductive vias 204, the thermal transmission structure TT1, the capacitors C1, the bonding vias 224, and the bonding pads 226. The conductive vias 204 are embedded in the semiconductor substrate 202. The thermal transmission structure TT1 is disposed on the semiconductor substrate 202 and the conductive vias 204. The capacitors C1, the bonding vias 224, and the bonding pads 226 are embedded in the thermal transmission structure TT1. The bonding vias 224 are in physical contact with the conductive plane 208 and the capacitors C1. Moreover, the bonding vias 224 are located between the conductive vias 204 and the bonding pads 226.

In some embodiments, subsequent processes such as a packing process and/or a bonding process may be performed on the thermal dissipation structure 200 to form a package structure. During the subsequent bonding process, the bonding pads 226 may serve as external connections of the thermal dissipation structure 200. The subsequent packaging process and/or the bonding process of the thermal dissipation structure 200 will be described below in conjunction with FIG. 1M to FIG. 1R.

Referring to FIG. 1M, a semiconductor die 400 is disposed on the thermal dissipation structure 200. In some embodiments, the semiconductor die 400 includes a semiconductor substrate 410, a bonding layer 420, a plurality of through semiconductor vias (TSV) 430, an interconnection structure 440, and a bonding layer 450. In some embodiments, the semiconductor substrate 410 is similar to the semiconductor substrate 202 in FIG. 1A, so the detailed description thereof is omitted herein. In some embodiments, the bonding layer 420 is disposed on the semiconductor substrate 410. For example, the bonding layer 420 is disposed between the semiconductor substrate 410 and the thermal dissipation structure 200. In some embodiments, the bonding layer 420 includes a dielectric layer 422 and a plurality of bonding pads 424. The materials of the dielectric layer 422 and the bonding pads 424 are respectively similar to the dielectric layer 232 and the bonding pads 226 in FIG. 1L, so the detailed descriptions thereof are omitted herein. As illustrated in FIG. 1M, the bonding pads 424 are physically in contact with the bonding pads 226 of the thermal dissipation structure 200. Meanwhile, the dielectric layer 422 are physically in contact with the dielectric layer 232. In other words, the bonding layer 420 of the semiconductor die 400 is hybrid bonded to the bonding pads 226 and the dielectric layer 232 of the thermal dissipation structure 200. That is, the semiconductor die 400 is hybrid bonded to the thermal dissipation structure 200. As illustrated in FIG. 1M, sidewalls of the bonding pads 424 are substantially aligned with sidewalls of the bonding pads 226. Moreover, since the bonding pads 424 are physically in contact with the bonding pads 226 of the thermal dissipation structure 200, an electrical connection is established between the semiconductor die 400 and the thermal dissipation structure 200.

In some embodiments, the interconnection structure 440 is disposed on the semiconductor substrate 410 opposite to the bonding layer 420. In some embodiments, the interconnection structure 440 includes a dielectric layer 442, a plurality of conductive patterns 446A, and a plurality of conductive vias 446B. For simplicity, the dielectric layer 442 is illustrated as a single dielectric layer and the conductive patterns 446A are illustrated as embedded in the dielectric layer 442. Nevertheless, from the perspective of the manufacturing process, the dielectric layer 442 is constituted by at least two dielectric layers, and the conductive patterns 446A are sandwiched between two adjacent dielectric layers. In some embodiments, the conductive patterns 446A located at different level heights are connected to each other through the conductive vias 446B. In other words, the conductive patterns 446A are electrically connected to one another through the conductive vias 446B. In some embodiments, the material of the dielectric layer 442 includes polyimide, epoxy resin, acrylic resin, phenol resin, benzocyclobutene (BCB), polybenzooxazole (PBO), or any other suitable polymer-based dielectric material. The dielectric layer 442, for example, may be formed by suitable fabrication techniques such as spin-on coating, chemical vapor deposition (CVD), plasma-enhanced chemical vapor deposition (PECVD), or the like. In some embodiments, a material of the conductive patterns 446A and the conductive vias 446B include aluminum, titanium, copper, nickel, tungsten, or alloys thereof. The conductive patterns 446A and the conductive vias 446B may be formed by, for example, electroplating, deposition, and/or photolithography and etching. In some embodiments, the conductive patterns 446A and the underlying conductive vias 446B may be formed simultaneously. It should be noted that the number of the dielectric layers 442, the number of the conductive patterns 446A the number of the conductive vias 446B illustrated in FIG. 1M are merely for illustrative purposes, and the disclosure is not limited thereto. In some alternative embodiments, fewer or more layers of the dielectric layers 442, the conductive patterns 446A, or the conductive vias 446B may be formed depending on the circuit design.

In some embodiments, the interconnection structure 440 further includes a device 444 formed therein. For example, the device 444 is connected to at least one of the conductive patterns 446A to establish electrical connection. In some embodiments, the device 444 includes active components (e.g., transistors or the like) and/or passive components (e.g., resistors, capacitors, inductors, or the like). For simplicity, one device 444 is shown in FIG. 1M. However, it should be understood that more than one devices 444 may be formed in the interconnection structure 440.

In some embodiments, the TSVs 430 penetrate through the semiconductor substrate 410 and further extend into a portion of the interconnection structure 440. For example, the TSVs 430 extend from the bonding pads 424 of the bonding layer 420 to the conductive patterns 446A, so as to establish electrical connection between the bonding layer 420 and the interconnection structure 440. In some embodiments, a material and a formation method of the TSVs 430 are respectively similar to those of the conductive vias 204 in FIG. 1A, so the detailed descriptions thereof are omitted herein.

In some embodiments, the bonding layer 450 is disposed on the interconnection structure 440. The bonding layer 450 includes a dielectric layer 452, a plurality of bonding vias 454, a dielectric layer 456, and a plurality of bonding pads 458. In some embodiments, a material of the dielectric layer 452 includes silicon oxide, silicon nitride, silicon oxynitride, tetraethosiloxane (TEOS), high-density plasma (HDP) oxide, plasma-enhanced TEOS (PETEOS), spin-on glass (SOG), fluorinated silicate glass (FSG), undoped silicate glass (USG), phosphosilicate glass (PSG), borosilicate glass (BSG), boron-doped phosphosilicate glass (BPSG), a combination thereof or the like, or a low-k dielectric material. In some embodiments, the dielectric layer 456 and the bonding pads 458 are disposed on the dielectric layer 452. Meanwhile, the bonding vias 454 penetrate through the dielectric layer 452 and are in physical contact with the bonding pads 458. In some embodiments, a formation method and a material of the bonding vias 454, the dielectric layer 456 and the bonding pads 458 are respectively similar to those of the bonding vias 224, the dielectric layer 228, and the bonding pads 226 in FIG. 1J to FIG. 1L, so the detailed descriptions thereof are omitted herein.

As mentioned above, the bonding layer 420 is disposed on one side of the semiconductor substrate 410 while the interconnection structure 440 and the bonding layer 450 are disposed on another side of the semiconductor substrate 410. In other words, the bonding layer 420 is disposed on a first side S1 of the semiconductor die 400 while the bonding layer 450 is disposed on a second side S2, which is opposite to the first side S1, of the semiconductor die 400.

Referring to FIG. 1N, a semiconductor die 600 is disposed on the semiconductor die 400. For example, the semiconductor die 600 is disposed on the semiconductor die 400 opposite to the thermal dissipation structure 200. In some embodiments, the semiconductor die 600 includes a semiconductor substrate 610, a plurality of through semiconductor vias (TSV) 620, a device 630, an interconnection structure 640, and a bonding layer 650. The semiconductor substrate 610 and the TSVs 620 of the semiconductor die 600 are respectively similar to the semiconductor substrate 410 and the TSVs 430 of the semiconductor die 400 in FIG. 1M, so the detailed descriptions thereof are omitted herein.

In some embodiments, the device 630 is at least partially embedded in the semiconductor substrate 610. In some embodiments, the device 630 includes active components (e.g., transistors or the like) and/or passive components (e.g., resistors, capacitors, inductors, or the like). For simplicity, one device 630 is shown in FIG. 1N. However, it should be understood that more than one devices may be formed in the semiconductor substrate 610.

In some embodiments, the interconnection structure 640 includes a dielectric layer 642, a plurality of conductive patterns 644A, a plurality of conductive vias 644B, and a device 646. The dielectric layer 642, the conductive patterns 644A, the conductive vias 644B, and the device 646 of the interconnection structure 640 are respectively similar to the dielectric layer 442, the conductive patterns 446A, the conductive vias 446B, and the device 444 of the interconnection structure 440 in FIG. 1M, so the detailed descriptions thereof are omitted herein.

As illustrated in FIG. 1N, the bonding layer 650 is disposed on the interconnection structure 640. The bonding layer 650 includes a dielectric layer 652, a plurality of bonding vias 654, a dielectric layer 656, and a plurality of bonding pads 658. In some embodiments, the dielectric layer 652, the bonding vias 654, the dielectric layer 656, and the bonding pads 658 of the bonding layer 650 are respectively similar to the dielectric layer 452, the bonding vias 454, the dielectric layer 456, and the bonding pads 458 of the bonding layer 450 in FIG. 1M, so the detailed descriptions thereof are omitted herein. As illustrated in FIG. 1N, the bonding pads 658 of the semiconductor die 600 are physically in contact with some of the bonding pads 458 of the semiconductor die 400. Meanwhile, the dielectric layer 656 of the semiconductor die 600 is physically in contact with the dielectric layer 456 of the semiconductor die 400. In other words, the bonding layer 650 of the semiconductor die 600 is hybrid bonded to the bonding layer 450 of the semiconductor die 400. That is, the semiconductor die 600 is hybrid bonded to the semiconductor die 400. As illustrated in FIG. 1N, sidewalls of the bonding pads 658 are substantially aligned with sidewalls of the bonding pads 458. Moreover, since the bonding pads 658 are physically in contact with some of the bonding pads 458 of the semiconductor die 400, an electrical connection is established between the semiconductor die 600 and the semiconductor die 400. It should be noted that since a dimension (for example, a width and/or a length) of the semiconductor 600 is smaller than a dimension of the semiconductor die 400, after the semiconductor die 600 is hybrid bonded to the semiconductor die 400, some of the bonding pads 458 of the semiconductor die 400 are still exposed.

After the semiconductor die 600 is hybrid bonded to the semiconductor die 400, a through insulating via (TIV) 300 is formed on the semiconductor die 400. In some embodiments, the TIV 300 is formed aside the semiconductor die 600 and is attached to the bonding pad 458 of the semiconductor die 400. In other words, the TIV 300 is directly in contact with the bonding pad 458 and is physically and electrically connected to the bonding layer 450 of the semiconductor die 400. The method of forming the TIV 300 will be described in detail below. First, a protection layer (not shown) may be formed to protect the semiconductor die 600. Subsequently, a seed material layer (not shown) is formed over the semiconductor die 400. In some embodiments, the seed material layer includes a titanium/copper composite layer and is formed by a sputtering process. Thereafter, a mask pattern (not shown) with opening is formed on the seed material layer. The openings of the mask pattern expose the intended locations for the subsequently formed TIV 300. For example, the opening of the mask pattern may correspond to the location of the exposed bonding pad 458. Afterwards, a plating process is performed to form a metal material layer (e.g., a copper layer) on the seed material layer exposed by the opening of the mask pattern. The mask pattern, the seed material layer not covered by the metal material layer, and the protection layer are then removed through a stripping process and an etching process to form the TIV 300. However, the disclosure is not limited thereto. In some alternative embodiments, other suitable methods may be utilized to form the TIV 300. For example, pre-fabricated TIV 300 may be picked-and-placed onto the semiconductor die 400.

After the TIV 300 is formed on the semiconductor die 400, an encapsulant 500 is formed over the semiconductor die 400 to laterally encapsulate the semiconductor die 600 and the TIV 300. In some embodiments, the TIV 300 is not revealed and is well protected by the encapsulant 500. In some embodiments, the encapsulant 500 includes a molding compound, a molding underfill, or the like. Alternatively, the encapsulant 500 may be a polymeric material, such as polyimide, epoxy resin, acrylic resin, phenol resin, BCB, PBO, or other suitable polymer-based dielectric materials. In some embodiments, the encapsulant 500 includes fillers. Alternatively, the encapsulant 500 may be free of fillers. In some embodiments, the encapsulant 500 may be formed by a molding process (such as a compression molding process) or a spin-coating process.

It should be noted that although FIG. 1M to FIG. 1N show that the semiconductor die 600 is hybrid bonded to the semiconductor die 400 prior to the formation of the TIV 300, the disclosure is not limited thereto. In some alternative embodiments, the TIV 300 may be formed on the semiconductor die 400 before the semiconductor die 600 is hybrid bonded to the semiconductor die 400.

Referring to FIG. 1N and FIG. 1O, the semiconductor substrate 610 and the encapsulant 500 are thinned until the TIV 300 and the TSV 620 are both exposed. In some embodiments, the semiconductor substrate 610 and the encapsulant 500 are thinned through a grinding process, such as a mechanical grinding process, a chemical mechanical polishing (CMP) process, or the like. After grinding, the semiconductor die 600 has a top surface that is substantially coplanar with a top surface of the TIV 300 and a top surface of the encapsulant 500. As illustrated in FIG. 1O, the encapsulant 500 is disposed on the semiconductor die 400 and laterally encapsulates the semiconductor die 600 and the TIV 300. In some embodiments, the TIV 300 penetrates through the encapsulant 500.

Referring to FIG. 1P, a portion of the semiconductor die 600 is removed to form a recess R. For example, a portion of the semiconductor substrate 610 is removed to form the recess R. As illustrated in FIG. 1P, the TSV 620 is partially located in the recess R. In some embodiments, at least a portion of the TSV 620 protrudes from the semiconductor substrate 610 of the semiconductor die 600. That is, the top surface of the TSV 620 is located at a level height higher than the top surfaces of the semiconductor die 600. In some embodiments, the semiconductor substrate 602 is partially removed through an etching process. The etching process includes, for example, an isotropic etching process and/or an anisotropic etching process. For example, the semiconductor substrate 602 may be partially removed through a wet etching process, a dry etching process, or a combination thereof.

Referring to FIG. 1Q, a protection layer 700 is formed to fill the recess R. In some embodiments, the protection layer 700 includes a molding compound, a molding underfill, or the like. Alternatively, the protection layer 700 may be a polymeric material, such as polyimide, epoxy resin, acrylic resin, phenol resin, BCB, PBO, or other suitable polymer-based dielectric materials. In some embodiments, the protection layer 700 includes fillers. Alternatively, the protection layer 700 may be free of fillers. In some embodiments, a material of the protection layer 700 is identical to the material of the encapsulant 500. However, the disclosure is not limited thereto. In some alternative embodiments, the material of the protection layer 700 may be different from the material of the encapsulant 500. As illustrated in FIG. 1Q, the protruding portion of the TSV 620 is laterally encapsulated by the protection layer 700. That is, the TSV 620 is partially wrapped around by the protection layer 700. In some embodiments, the protection layer 700 may be formed by an over-molding process. For example, an insulating material (not shown) may be formed on the encapsulant 500 and the TIV 300. The insulating material also fills up the recess R. Thereafter, the insulating material is thinned until the TIV 300 and the TSV 620 are revealed. In some embodiments, the insulating material may be thinned through a mechanical grinding process, a CMP process, or the like. As illustrated in FIG. 1Q, the top surface of the encapsulant 500, the top surface of the TIV 300, the top surface of the TSV 620, and a top surface of the protection layer 700 are substantially coplanar.

Referring to FIG. 1R, a redistribution structure 800, a passivation layer 900, a plurality of under-ball metallurgy (UBM) patterns 1000, and a plurality of conductive terminals 1100 are formed over the TIV 300, the encapsulant 500, the semiconductor die 600, and the protection layer 700. As illustrated in FIG. 1R, the redistribution structure 800 is formed on the TIV 300, the encapsulant 500, the semiconductor die 600, and the protection layer 700. In other words, the redistribution structure 800 is disposed on a side of the semiconductor die 600 opposite of the bonding layer 650. In some embodiments, the redistribution structure 800 includes a dielectric layer 810, a plurality of conductive patterns 820A, and a plurality of conductive vias 820B. For simplicity, the dielectric layer 810 is illustrated as a single dielectric layer and the conductive patterns 820A are illustrated as embedded in the dielectric layer 810. Nevertheless, from the perspective of the manufacturing process, the dielectric layer 810 is constituted by at least two dielectric layers, and the conductive patterns 820A are sandwiched between two adjacent dielectric layers. In some embodiments, the conductive patterns 820A located at different level heights are connected to one another through the conductive vias 820B. In other words, the conductive patterns 820A are electrically connected to one another through the conductive vias 820B. In some embodiments, some of the bottommost conductive patterns 820A are directly in contact with the TSV 620 of the semiconductor die 600 such that an electrical connection is established. In other words, the redistribution structure 800 is electrically connected to the semiconductor die 600. In some embodiments, some of the bottommost conductive patterns 820A are also directly in contact with the TIV 300. In other words, the redistribution structure 800 is connected to the bonding layer 450 through the TIV 300. In other words, electrical connection is established between the redistribution structure 800 and the semiconductor die 400 through the TIV 300.

In some embodiments, a material of the dielectric layer 810 includes polyimide, epoxy resin, acrylic resin, phenol resin, BCB, PBO, or any other suitable polymer-based dielectric material. The dielectric layer 810, for example, may be formed by suitable fabrication techniques such as spin-on coating, CVD, PECVD, or the like. In some embodiments, a material of the conductive patterns 820A and the conductive vias 820B includes aluminum, titanium, copper, nickel, tungsten, or alloys thereof. The conductive patterns 820A and the conductive vias 820B may be formed by, for example, electroplating, deposition, and/or photolithography and etching. In some embodiments, the conductive patterns 820A and the underlying conductive vias 820B are formed simultaneously. It should be noted that the number of the dielectric layers 810, the number of the conductive patterns 820A, and the number of the conductive vias 820B illustrated in FIG. 1R are merely for illustrative purposes, and the disclosure is not limited thereto. In some alternative embodiments, fewer or more layers of the dielectric layers 810, the conductive patterns 820A, or the conductive vias 820B may be formed depending on the circuit design.

In some embodiments, the passivation layer 900 is disposed on the redistribution structure 800. In some embodiments, a material of the passivation layer 900 includes polyimide, epoxy resin, acrylic resin, phenol resin, BCB, PBO, or any other suitable polymer-based dielectric material. The passivation layer 900, for example, may be formed by suitable fabrication techniques such as spin-on coating, CVD, PECVD, or the like.

As illustrated in FIG. 1R, the UBM patterns 1000 are formed over the redistribution structure 800 and the passivation layer 900. In some embodiments, the UBM patterns 1000 are formed by the following steps. First, a plurality of contact openings (not shown) is formed in the passivation layer 900. The contact openings expose the topmost conductive patterns 820A of the redistribution structure 800. Then, a seed material layer (not shown) is formed over the passivation layer 900 and in the contact openings. The seed material layer extends into the contact openings to be in direct contact with the topmost conductive patterns 820A of the redistribution structure 800. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed UBM patterns 1000. For example, the openings of the mask pattern may expose the seed material layer located inside of the contact openings and the seed material layer in proximity of the contact openings. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the UBM patterns 1000.

In some embodiments, the UBM patterns 1000 are electrically connected to the topmost conductive patterns 820A of the redistribution structure 800. As such, the UBM patterns 1000 may be electrically connected to the semiconductor die 600 through the redistribution structure 800 and the semiconductor die 400 through the redistribution structure 800 and the TIV 300.

As illustrated in FIG. 1R, the conductive terminals 1100 are disposed over the redistribution structure 800. For example, the conductive terminals 1100 are disposed on the UBM patterns 1000. In some embodiments, the conductive terminals 1100 are attached to the UBM patterns 1000 through a solder flux. In some embodiments, the conductive terminals 1100 are, for example, solder balls, ball grid array (BGA) balls, or controlled collapse chip connection (C4) bumps. In some embodiments, the conductive terminals 1100 are made of a conductive material with low resistivity, such as Sn, Pb, Ag, Cu, Ni, Bi, or an alloy thereof.

After the conductive terminals 1100 are formed, a singulation process is performed to form a plurality of packages structures 10. In some embodiments, the dicing process or the singulation process typically involves dicing with a rotating blade or a laser beam. In other words, the dicing or singulation process is, for example, a laser cutting process, a mechanical cutting process, or other suitable processes. As illustrated in FIG. 1R, the semiconductor die 400 is disposed on the thermal dissipation structure 200, and the semiconductor die 600 is disposed on the semiconductor die 400 opposite to the thermal dissipation structure 200. In some embodiments, the thermal dissipation structure 200 provides a thermal dissipation solution for the semiconductor die 400 and the semiconductor die 600. For example, heat generated by the semiconductor die 400 and the semiconductor die 600 will respectively be routed to the thermal transmission structure TT1 of the thermal dissipation structure 200 through its respective conductive structures, and the heat will be further transferred out of the package structure 10 through the conductive vias 204 in the thermal dissipation structure 200. In other words, with the aid of the thermal dissipation structure 200, the thermal dissipation rate of the package structure 10 may be increased, and the performance of the package structure 10 may be enhanced. Furthermore, as mentioned above, the capacitors C1 are embedded in the thermal dissipation structure 200. Therefore, the thermal dissipation structure 200 not only serves as a thermal dissipation mechanism, but is also able to provide storage of capacitance. Therefore, with the presence of the thermal dissipation structure 200, the overall electrical performance of the package structure 10 may be further enhanced.

Figure 2A:
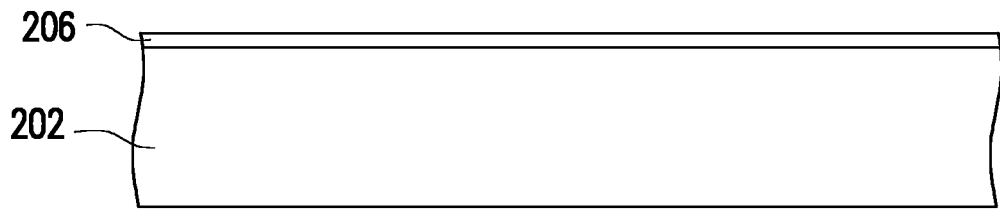
FIG. 2A to FIG. 2R are schematic cross-sectional views illustrating various stages of a manufacturing method of a package structure in accordance with some alternative embodiments of the disclosure.
Figure 2B:
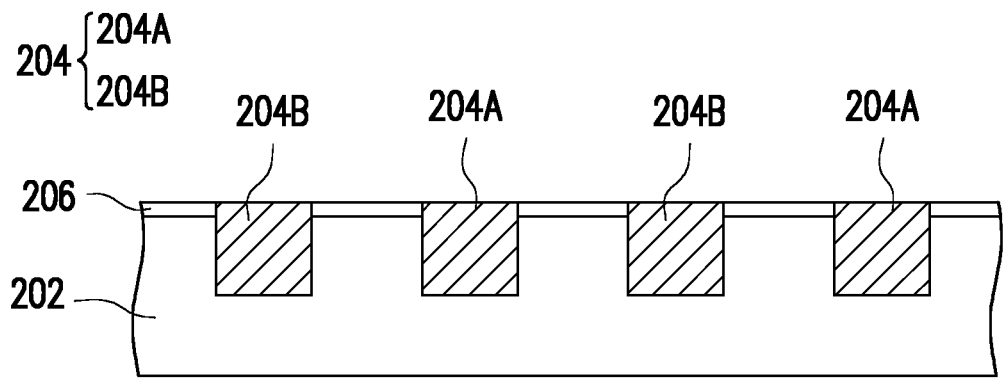
Figure 2C:
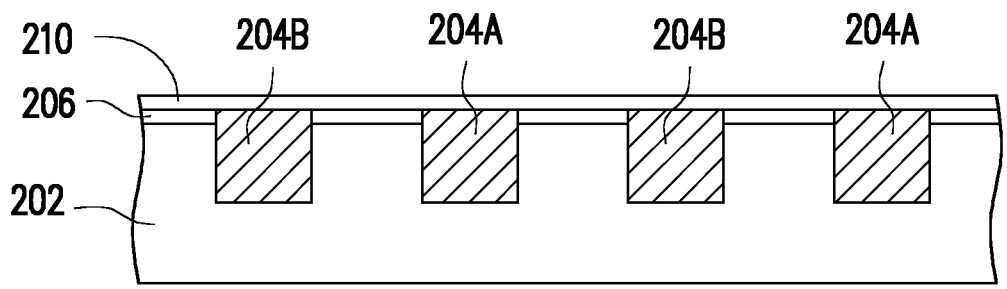
Figure 2D:
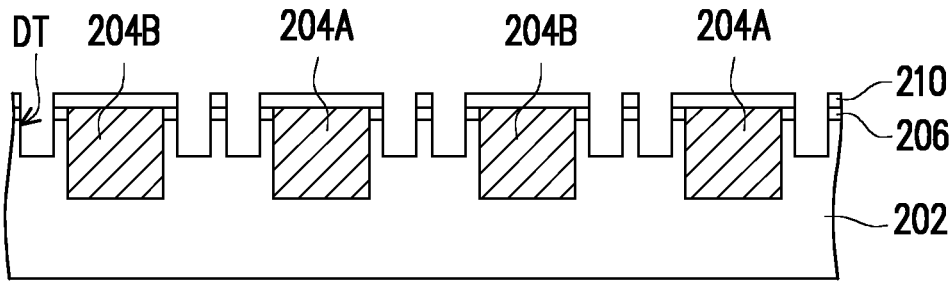
Figure 2E:
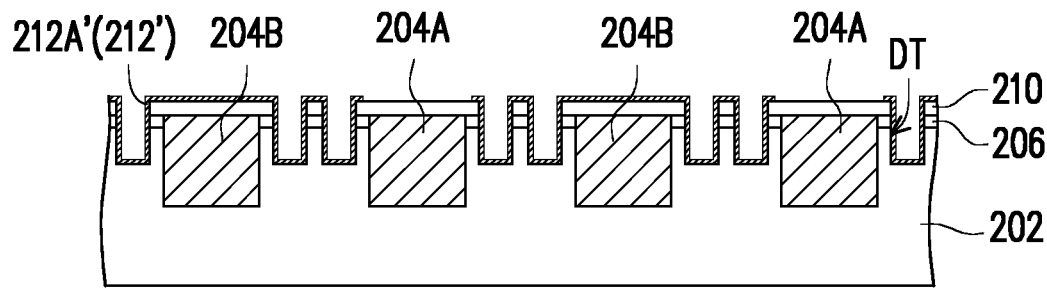
Figure 2F:
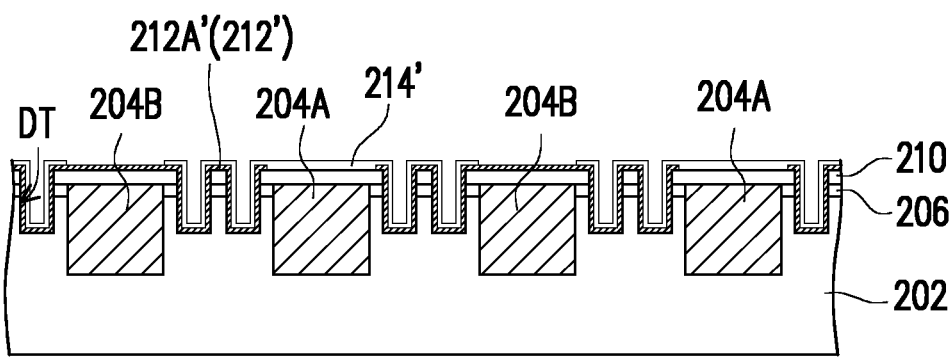
Figure 2G:
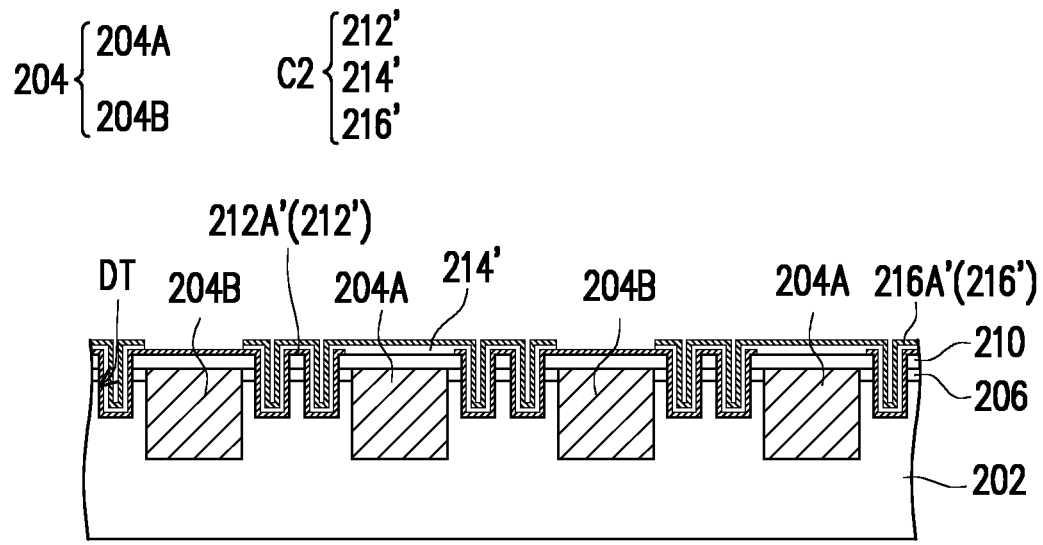
Figure 2H:
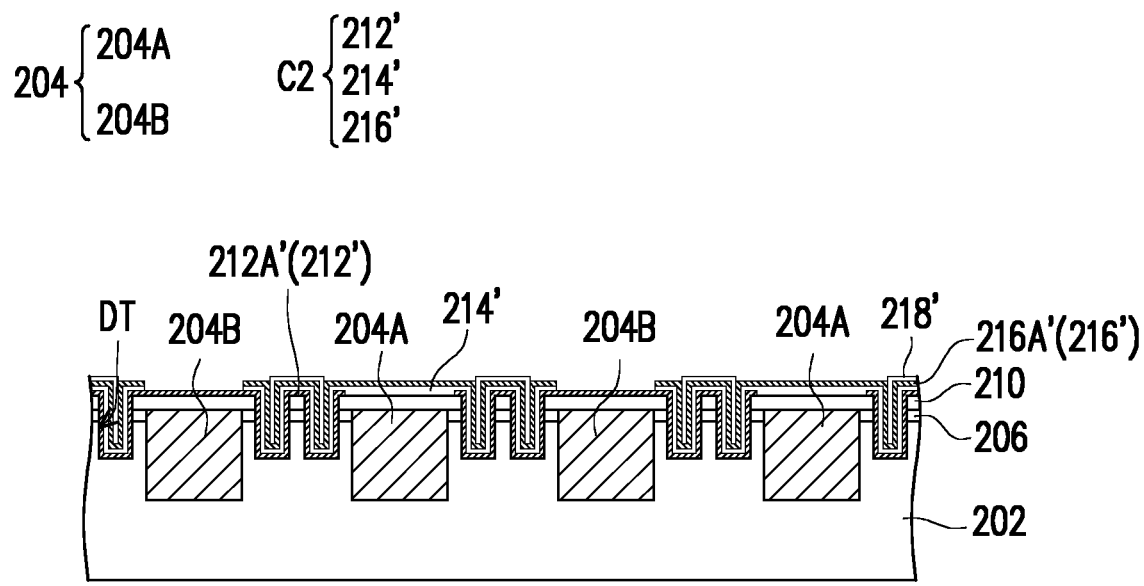
Figure 2I:
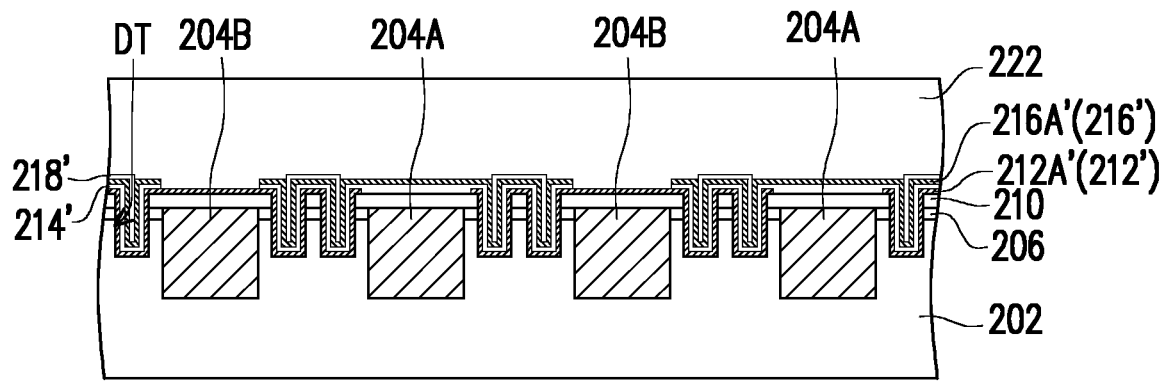
Figure 2J:
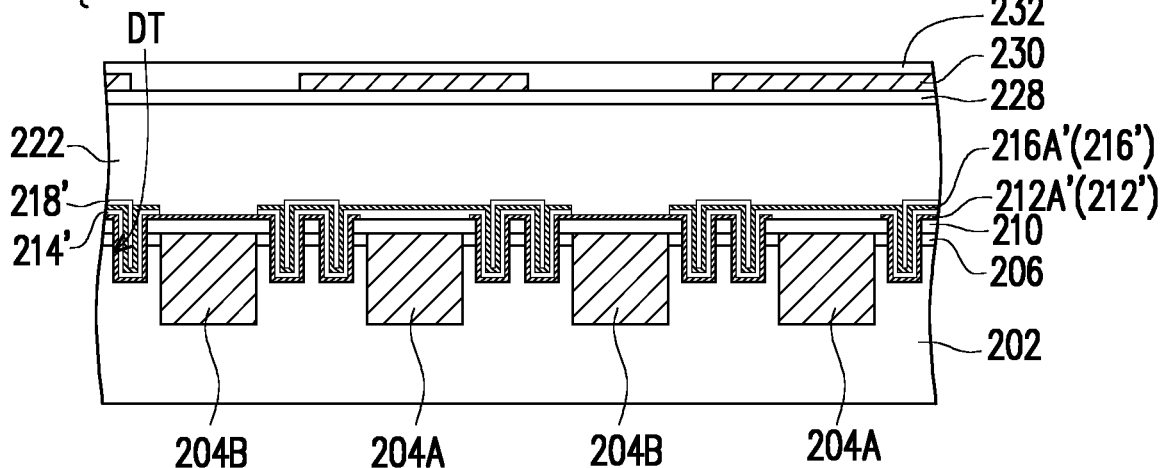
Figure 2K:
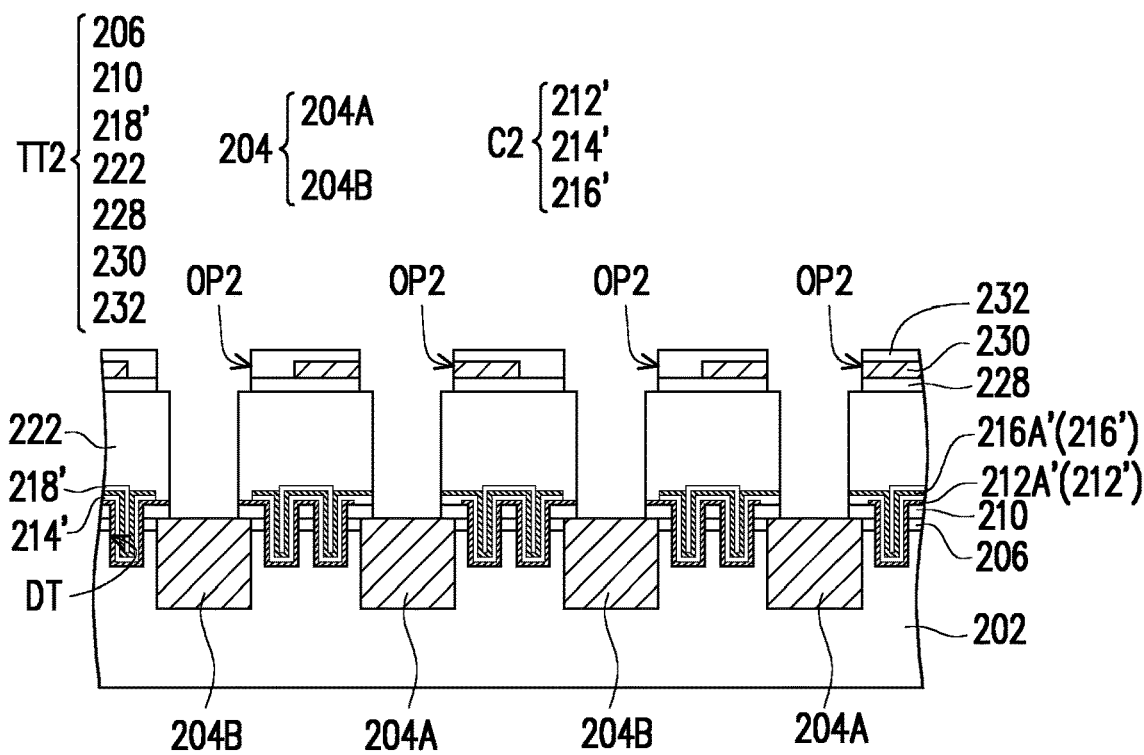
Figure 2L:
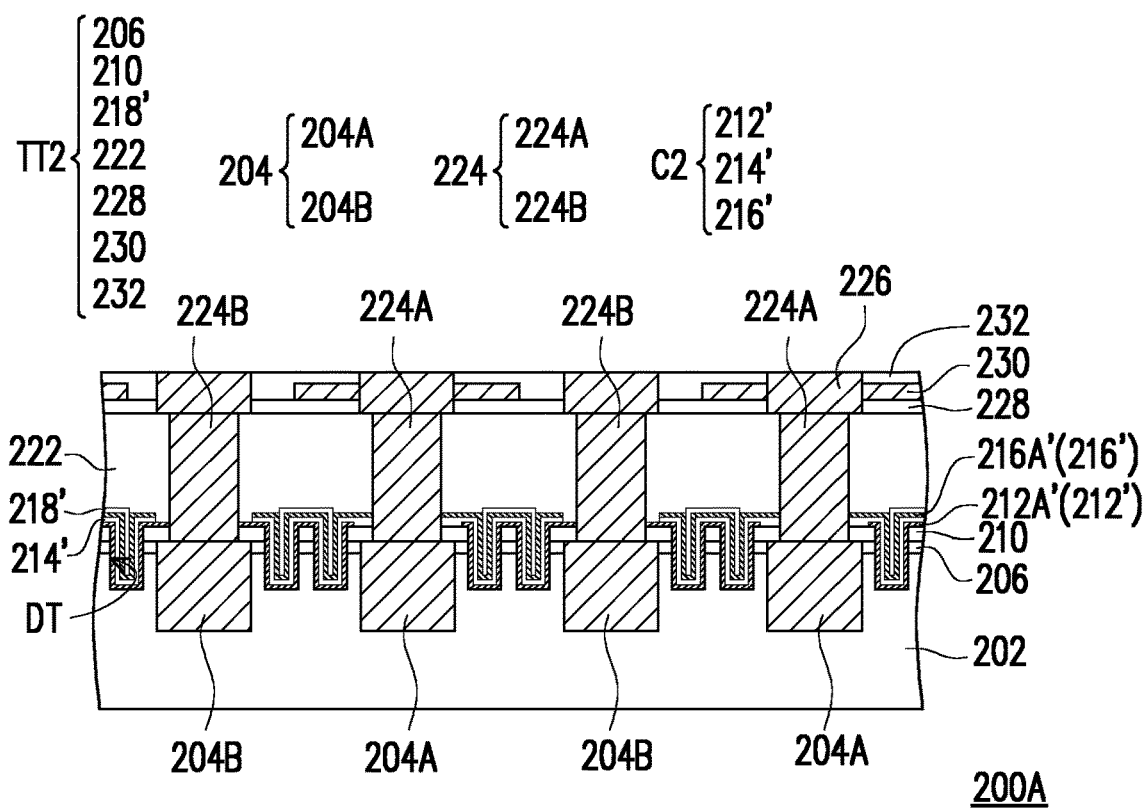
Figure 2M:
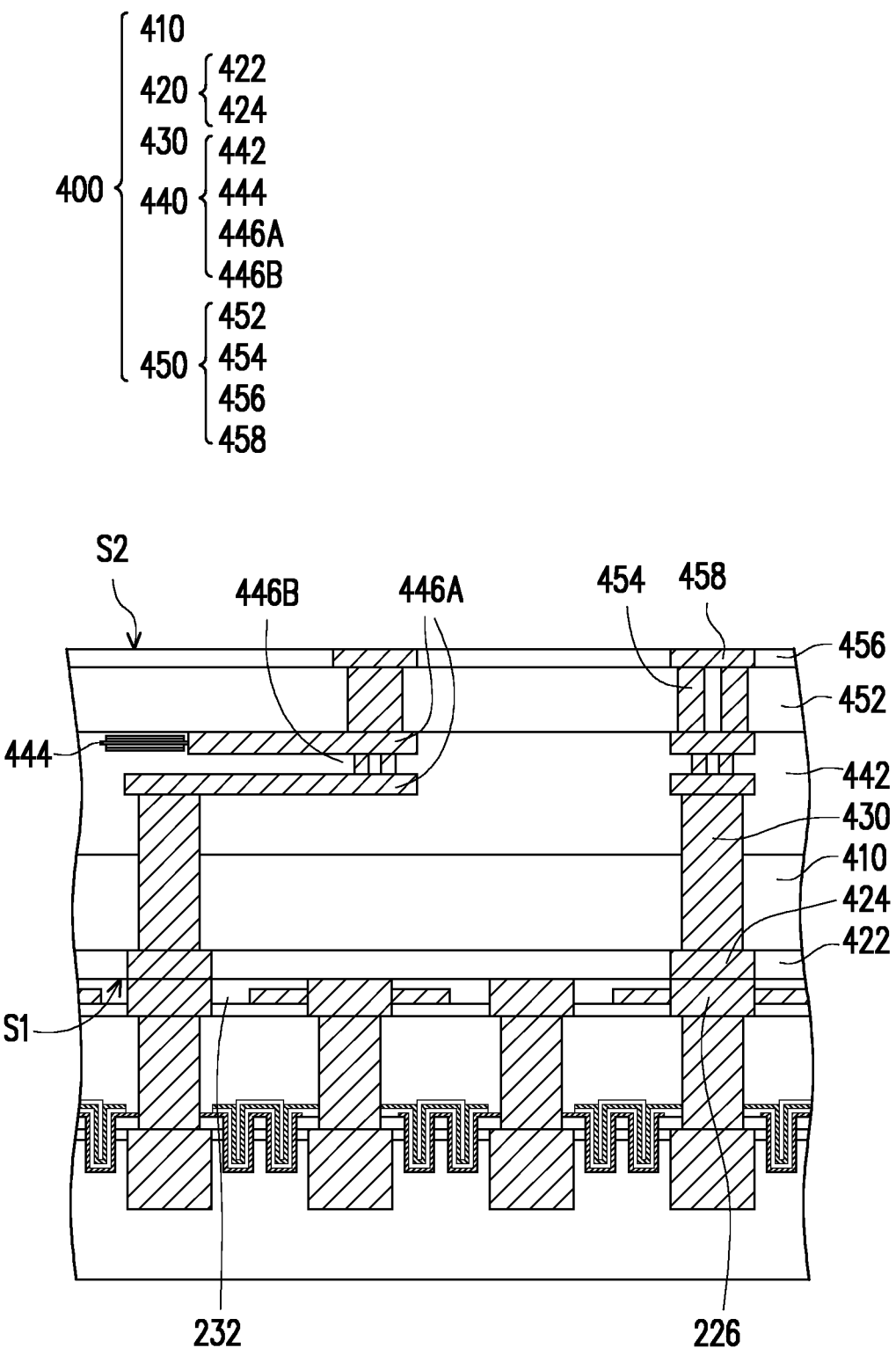
Figure 2N:
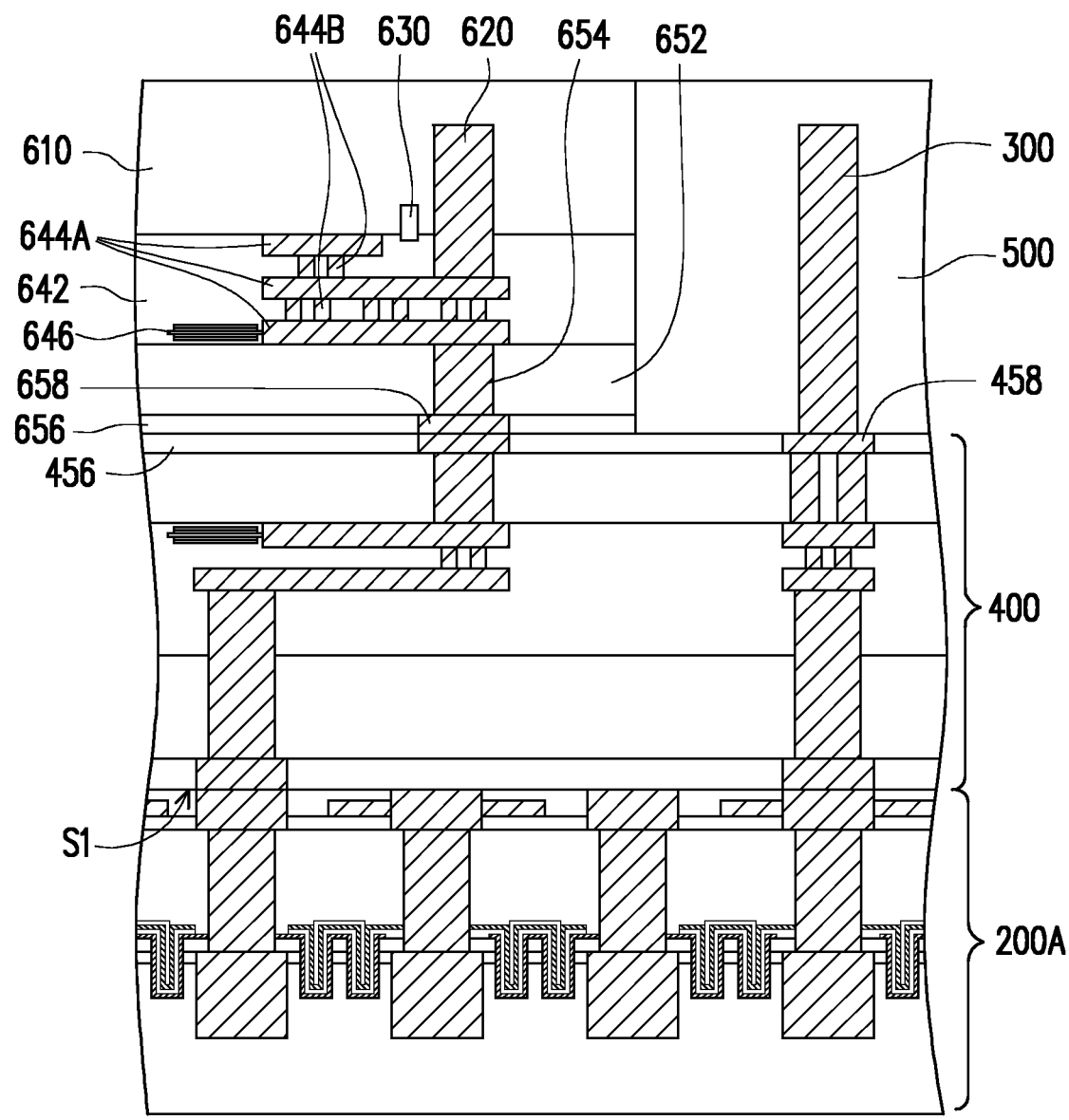
Figure 20:
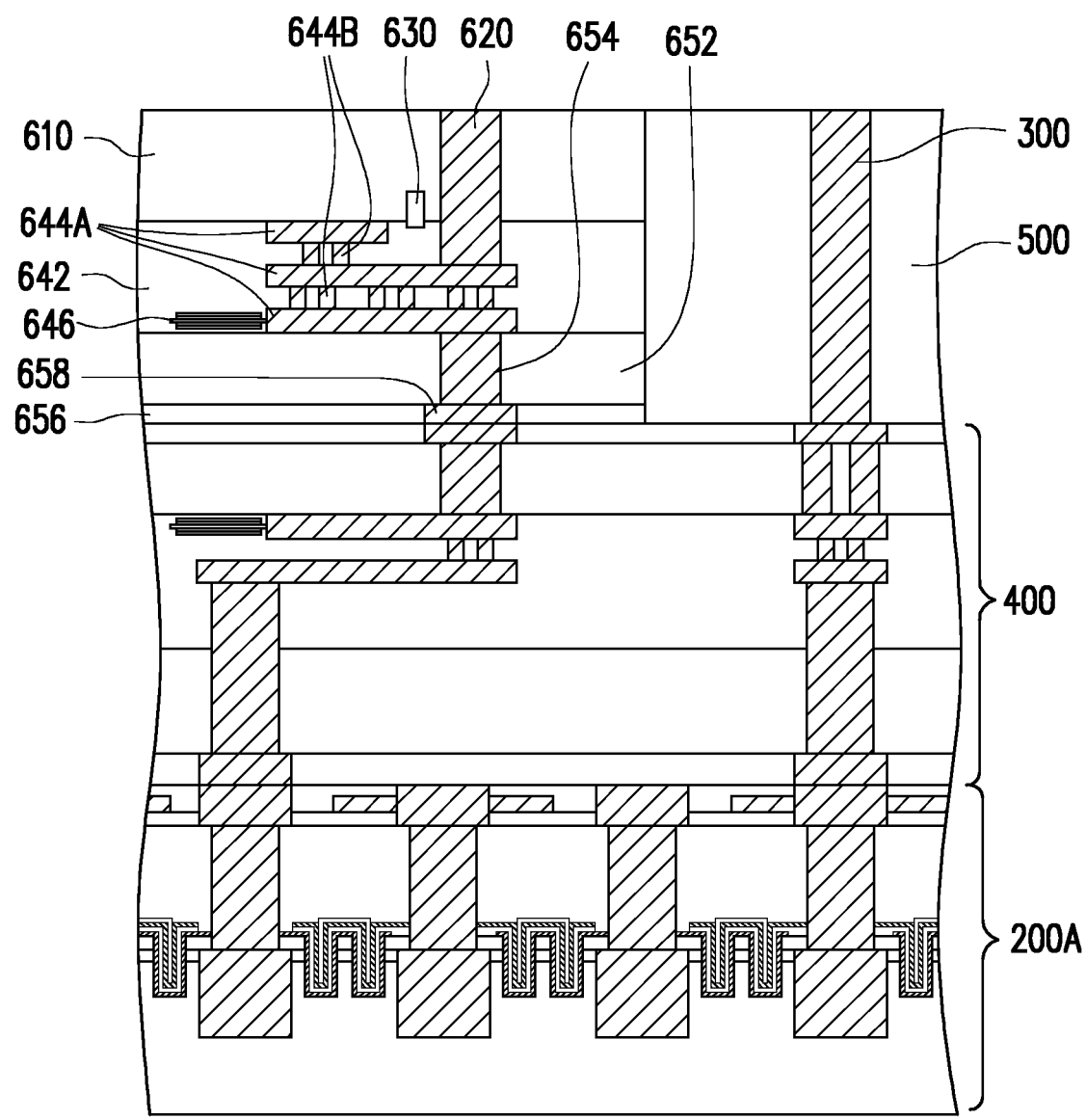
Figure 2P:
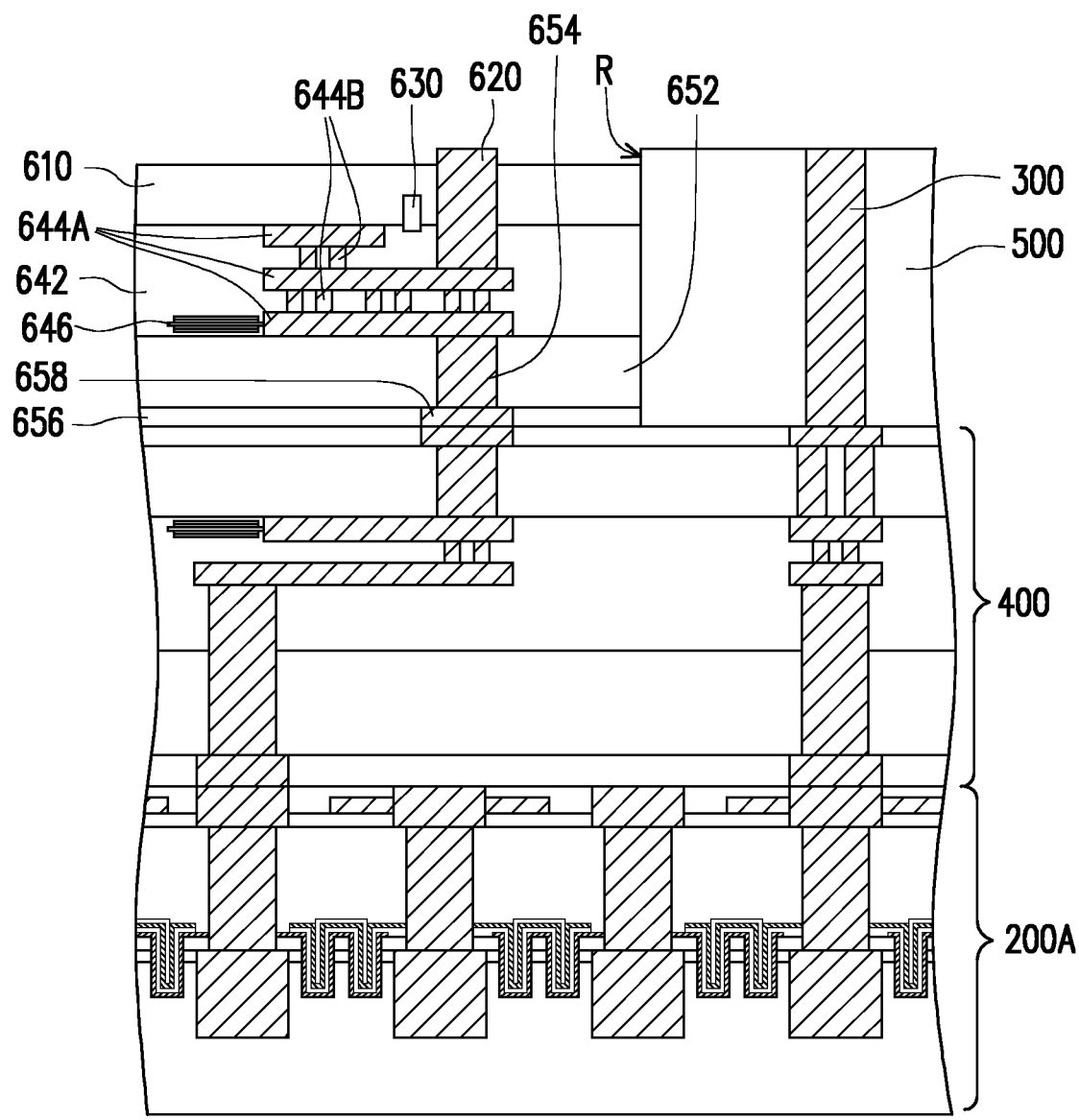
Figure 2Q:
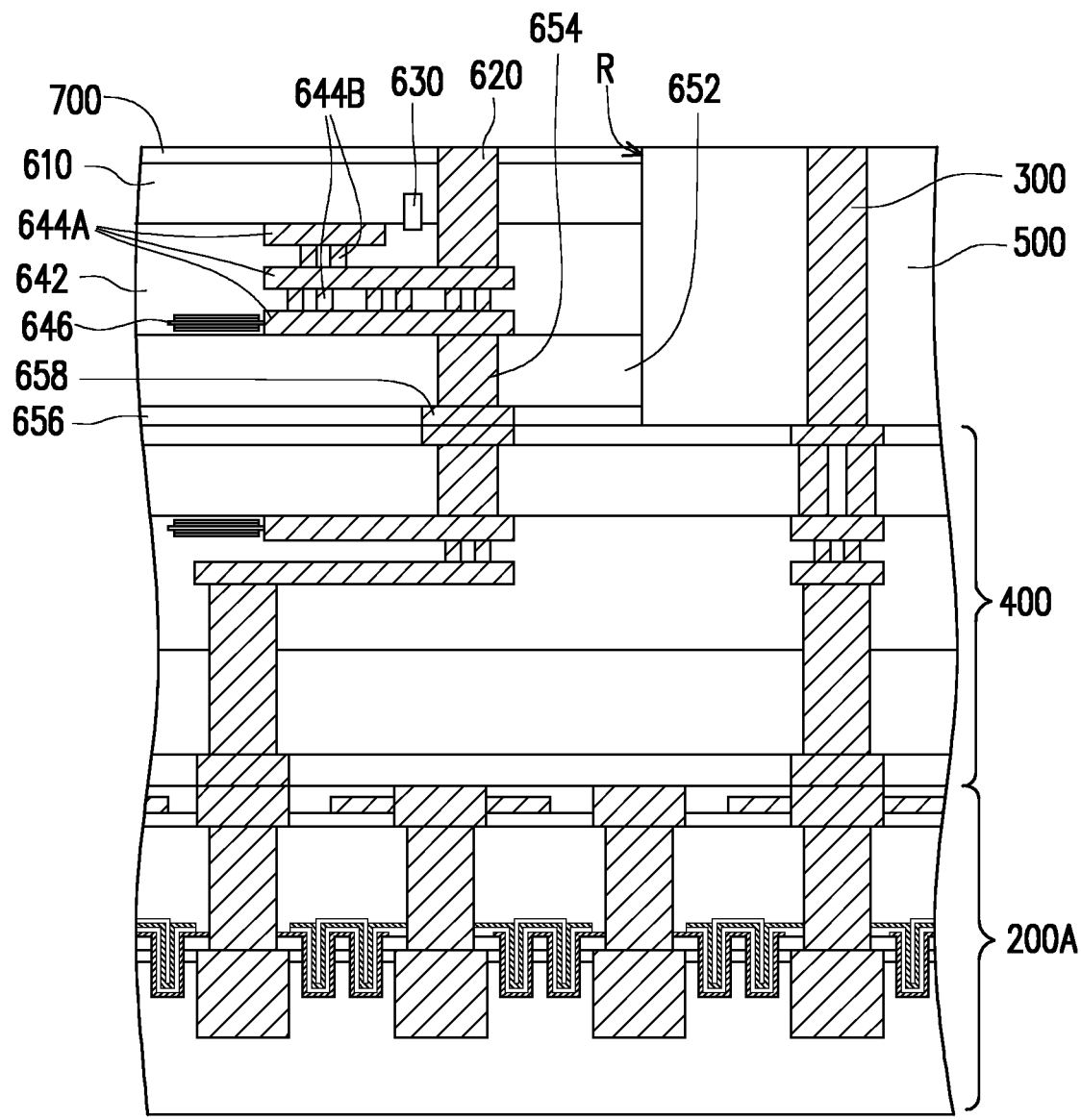
Figure 2R:
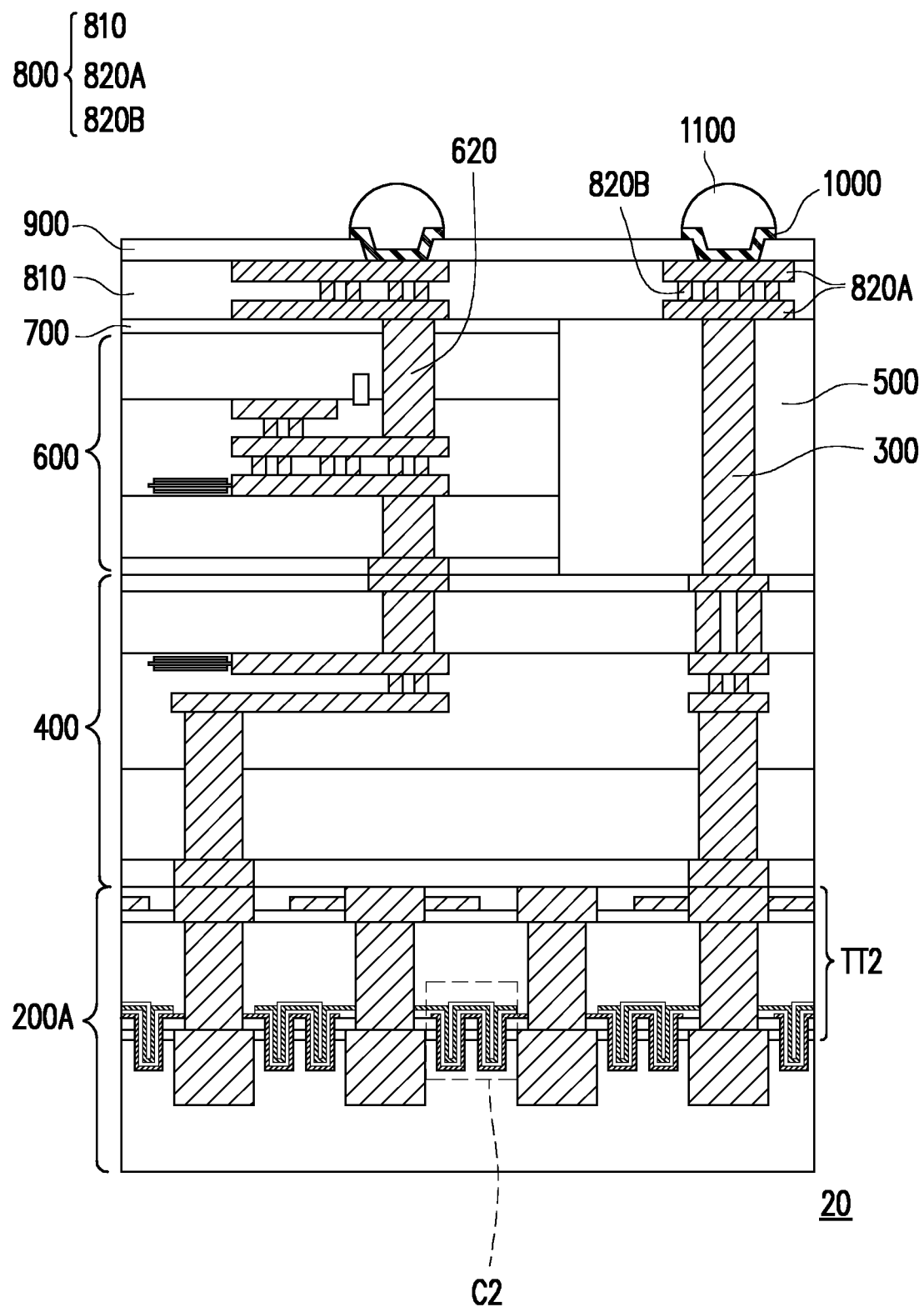

FIG. 2A to FIG. 2R are schematic cross-sectional views illustrating various stages of a manufacturing method of a package structure 20 in accordance with some alternative embodiments of the disclosure. Referring to FIG. 2A to FIG. 2B, the steps in FIG. 2A to FIG. 2B are similar to the steps shown in FIG. 1A to FIG. 1B, so similar elements are denoted by the same reference numeral and the detailed descriptions thereof are omitted herein. The difference between FIG. 2A to FIG. 2B and FIG. 1A to FIG. 1B lies in that in FIG. 2B, there are two second conductive vias 204B and two first conductive vias 204A instead of one second conductive via 204B and three first conductive vias 204A. As illustrated in FIG. 2C, the first conductive 204A and the second conductive via 204B are arranged in an alternating manner along a horizontal direction.

Referring to FIG. 2C, a dielectric layer 210 is formed on the dielectric layer 206 and the conductive vias 204. In some embodiments, the material and formation method of the dielectric layer 210 in FIG. 2C are respectively similar to the dielectric layer 210 in FIG. 1D, so the detailed description thereof are omitted herein.

Referring to FIG. 2D, a portion of the semiconductor substrate 202, a portion of the dielectric layer 206, and a portion of the dielectric layer 210 are removed to form a plurality of trenches DT. As illustrated in FIG. 2D, two trenches DT are formed between adjacent conductive vias 204. However, the disclosure is not limited thereto. In some alternative embodiments, the number of trenches DT between adjacent conductive vias 204 may be more than two or less than two. In some embodiments, the trenches DT extend into the semiconductor substrate 202 from a top surface of the dielectric layer 210. In some embodiments, the trenches DT are formed by an etching process, such as a reactive ion etching (RIE) process.

Referring to FIG. 2E, a conductive layer 212' is formed over the dielectric layer 210, the dielectric layer 206, and the semiconductor substrate 202. For example, the conductive layer 212' extends into the trenches DT to cover sidewalls and bottom surfaces of the trenches DT. Meanwhile, the conductive layer 212' also covers at least a portion of the top surface of the dielectric layer 210. The conductive layer 212' may be a single-layer structure or a multi-layer structure. In some embodiments, the conductive layer 212' is formed by deposition, such as by CVD or PVD. In some embodiments, a material of the conductive layer 212' is similar to that of the conductive layer 212 in FIG. 1D, so the detailed description thereof is omitted herein.

In some embodiments, the conductive layer 212' includes a plurality of conductive patterns 212A' spaced apart from one another. As illustrated in FIG. 2E, the conductive patterns 212A' completely covers the top surface of the dielectric layer 210 directly above the second conductive via 204B but partially covers the top surface of the dielectric layer 210 directly above the first conductive via 204A. In other words, two conductive patterns 212A' are physically isolated from each other such that a gap is formed to expose a portion of the dielectric layer 210 directly above the first conductive vias 204A.

Referring to FIG. 2F, an insulating layer 214' is formed over the conductive layer 212' and the dielectric layer 210. For example, the insulating layer 214' extends from a top surface of the conductive layer 212' into the trenches DT. In some embodiments, the insulating layer 214' is conformal with the conductive layer 212' and fills into the gaps between the two physically isolated conductive patterns 212A', so as to cover the exposed portion of the dielectric layer 210. In some embodiments, the insulating layer 214' partially covers the top surface of the conductive patterns 212A' directly above the second conductive vias 204B. For example, a gap exists between patterns of the insulating layer 214' to partially expose the underlying conductive layer 212' directly above the second conductive vias 204B. That is, the insulating layer 214' partially covers the underlying conductive patterns 212A'. In some embodiments, a formation method and a material of the insulating layer 214' are similar to those of the insulating layer 214 in FIG. 1E, so the detailed descriptions thereof are omitted herein.

Referring to FIG. 2G, a conductive layer 216' is formed over the insulating layer 214'. For example, the conductive layer 216' is conformal with the insulating layer 214' and extends into the trenches DT. In some embodiments, a formation method and a material of the conductive layer 216' are similar to those of the conductive layer 212' in FIG. 2E, so the detailed descriptions thereof are omitted herein. In some embodiments, the conductive layer 216' includes a plurality of conductive patterns 216A' spaced apart from one another. As illustrated in FIG. 2G, the conductive layer 216' (i.e. the conductive patterns 216A') covers the entire top surface of the insulating layer 214'. Since the insulating layer 214' is not a continuous layer, at least two of the conductive patterns 216A' are physically and electrically isolated. For example, a gap exists between two of the conductive patterns 216A' to partially expose the conductive layer 212' directly above the second conductive vias 204B. However, the disclosure is not limited thereto. In some alternative embodiments, the conductive patterns 216A' are connected directly above the second conductive via 204B but are physically isolated directly above the first conductive vias 204A.

In some embodiments, the conductive layer 212', the insulating layer 214', and the conductive layer 216' form a plurality of capacitors C2. For example, the conductive patterns 212A', the corresponding insulating layer 214', and the corresponding conductive patterns 216A' collectively form one of the capacitors C2. In some embodiments, since the conductive layer 212', the insulating layer 214', and the conductive layer 216' are stacked in metal-insulator-metal manner, the capacitors C2 are referred to as "metal-insulator-metal (MIM)" capacitors. In some embodiments, since the conductive layer 212', the insulating layer 214', and the conductive layer 216' are at least partially located within the trenches DT, the capacitors C2 are also referred to as "deep trench" capacitors.

Referring to FIG. 2H, a dielectric layer 218' is formed over the conductive layer 216'. In some embodiments, the dielectric layer 218' partially fills in the trenches DT. For example, the dielectric layer 218' is disposed horizontally on top of the conductive layer 216' in between the trenches DT and extends vertically into the trenches DT. In some embodiments, the dielectric layer 218' resembles an upside down U-shape. In some embodiments, the conductive layer 212', the insulating layer 214', the conductive layer 216', and the dielectric layer 218' collectively fill up the trenches DT. In some embodiments, a formation method and a material of the dielectric layer 218' are similar to those of the dielectric layer 222 in FIG. 1I, so the detailed descriptions thereof are omitted herein.

Referring to FIG. 2I, a dielectric layer 222 is formed over the capacitors C2 and the dielectric layer 218'. For example, the dielectric layer 222 completely covers the top surface of the dielectric layer 218', the top surface of the conductive layer 216', and the top surface of the exposed conductive layer 212'. A formation method and a material of the dielectric layer 222 in FIG. 2I are similar to those of the dielectric layer 222 in FIG. 1I, so the detailed descriptions thereof are omitted herein.

Referring to FIG. 2J, a dielectric layer 228, a conductive plane 230, and a dielectric layer 232 are sequentially formed on the dielectric layer 222. In some embodiments, the step shown in FIG. 2J is similar to the step shown in FIG. 1J, so similar elements are denoted by the same reference numeral and the detailed descriptions thereof are omitted herein. The difference between FIG. 2J to FIG. 1J lies in that in FIG. 2J, two gaps are shown between three electrically and physically isolated portions of the conductive plane 230.

In some embodiments, the dielectric layer 206, the dielectric layer 210, the dielectric layer 218', the dielectric layer 222, the dielectric layer 228, the conductive plane 230, and the dielectric layer 232 may serve as a thermal transmission path for the subsequently formed package structure, so these elements are collectively referred to as a thermal transmission structure TT2.

Referring to FIG. 2K, a portion of the dielectric layer 232, a portion of the conductive plane 230, a portion of the dielectric layer 228, a portion of the dielectric layer 222, a portion of the conductive layer 216', a portion of the dielectric layer 214', a portion of the conductive layer 212', and a portion of the dielectric layer 210 are removed to form a plurality of openings OP2. For example, the dielectric layer 232, the conductive plane 230, the dielectric layer 228, the dielectric layer 222, the conductive layer 216', the dielectric layer 214', the conductive layer 212', and the dielectric layer 210 are patterned by a patterning process to form the openings OP2. The patterning process includes photolithography and one or more etching processes, for example. In some embodiments, the patterning process includes a dual-damascene patterning process, so each opening OP2 has a via portion connected to a trench portion. In some embodiments, some of the trench portions of the openings OP2 penetrate through the dielectric layer 232 and the dielectric layer 228 while the rest of the trench portions of the opening OP2 penetrate through the dielectric layer 232, the conductive plane 230, and the dielectric layer 228. In some embodiments, some of the via portions of the openings OP2 penetrate through the dielectric layer 222, the conductive layer 212', and the dielectric layer 210 while the rest of the via portions of the openings OP2 penetrate through the dielectric layer 222, the conductive layer 216', the dielectric layer 214', and the dielectric layer 210. For example, some of the openings OP2 expose a portion of a top surface of the first conductive vias 204A while the rest of the openings OP2 expose a portion of a top surface of the second conductive vias 204B.

Referring to FIG. 2L, a plurality of bonding vias 224 and a plurality of bonding pads 226 are formed. In some embodiments, the step shown in FIG. 2L is similar to the step shown in FIG. 1L, so similar elements are denoted by the same reference numeral and the detailed descriptions thereof are omitted herein. The difference between FIG. 2L to FIG. 1L lies in that in FIG. 2L, four bonding vias 224 and four bonding pads 226 are formed. In some embodiments, the bonding vias 224 include first bonding vias 224A and second bonding vias 224B. As illustrated in FIG. 2L, the first bonding vias 224A are disposed on the first conductive vias 204A while the second bonding vias 224B are disposed on the second conductive vias 204B. In other words, the first bonding vias 224A are electrically and physically connected to the first conductive vias 204A while the second bonding vias 224B are electrically and physically connected to the second conductive vias 204B. In some embodiments, the dielectric layer 222 is located aside of the bonding vias 224 and is in physical contact with the sidewalls of the bonding vias 224.

As illustrated in FIG. 2L, the capacitors C2 are located aside of the bonding vias 224 and are in physical contact with sidewalls of the bonding vias 224. In other words, the capacitors C2 are electrically connected to the bonding vias 224. In some embodiments, since the bonding vias 224 are electrically connected to the conductive vias 204, the capacitors C2 are also electrically connected to the conductive vias 204 through the bonding vias 224. In some embodiments, the conductive patterns 212A' are in physical contact with sidewalls of the second bonding vias 224B. Meanwhile, the conductive patterns 216A' and the dielectric layer 214' are in physical contact with sidewalls of the first bonding vias 224A. In other words, the conductive patterns 216A' are physically and electrically connected to the first bonding vias 224A while the conductive patterns 212A' are physically and electrically connected to the second bonding vias 224B. In some embodiments, the first bonding vias 224A are electrically connected to the ground voltage through the first conductive vias 204A and the second bonding vias 224B are electrically connected to the voltage different from the ground voltage through the second conductive vias 204B. As such, the conductive patterns 216A' are electrically connected to the ground voltage and the conductive patterns 212A' are electrically connected to the voltage different from the ground voltage.

In some embodiments, the structure illustrated in FIG. 2L may serve as a thermal dissipation mechanism for the subsequently formed package structure, so the structure illustrated in FIG. 2L is referred to as a thermal dissipation structure 200A. As illustrated in FIG. 2L, the thermal dissipation structure 200A includes the semiconductor substrate 202, the conductive vias 204, the thermal transmission structure TT2, the capacitors C2, the bonding vias 224, and the bonding pads 226. The thermal transmission structure TT2 is disposed on the semiconductor substrate 202 and the conductive vias 204. In some embodiments, the conductive vias 204 and the capacitors C2 are partially embedded in the semiconductor substrate 202. For example, a portion of each conductive via 204 and a portion of each capacitor C2 are embedded in the semiconductor substrate 202. Meanwhile, another portion of each conductive via 204 and another portion of each capacitor C2 are embedded in the thermal transmission structure TT2. The bonding vias 224 and the bonding pads 226 are embedded in the thermal transmission structure TT2. The bonding vias 224 are in physical contact with the conductive vias 204. Moreover, the bonding vias 224 are sandwiched between the conductive vias 204 and the bonding pads 226.

In some embodiments, subsequent processes such as a packing process and/or a bonding process may be performed on the thermal dissipation structure 200A to form a package structure. During the subsequent bonding process, the bonding pads 226 may serve as external connections of the thermal dissipation structure 200. The subsequent packaging process and/or the bonding process of the thermal dissipation structure 200A will be described below in conjunction with FIG. 2M to FIG. 2R.

Referring to FIG. 2M to FIG. 2R, the steps in FIG. 2M to FIG. 2R are similar to the steps shown in FIG. 1M to FIG. 1R, so similar elements are denoted by the same reference numeral and the detailed descriptions thereof are omitted herein.

As illustrated in FIG. 2R, a plurality of packages structures 20 is obtained. In some embodiments, the semiconductor die 400 is disposed on the thermal dissipation structure 200A, and the semiconductor die 600 is disposed on the semiconductor die 400 opposite to the thermal dissipation structure 200A. In some embodiments, the thermal dissipation structure 200A provides a thermal dissipation solution for the semiconductor die 400 and the semiconductor die 600. For example, heat generated by the semiconductor die 400 and the semiconductor die 600 will respectively be routed to the thermal transmission structure TT2 of the thermal dissipation structure 200A through its respective conductive structures, and the heat will be further transferred out of the package structure 20 through the conductive vias 204 in the thermal dissipation structure 200A. In other words, with the aid of the thermal dissipation structure 200A, the thermal dissipation rate of the package structure 20 may be increased, and the performance of the package structure 20 may be enhanced. Furthermore, as mentioned above, the capacitors C2 are embedded in the thermal dissipation structure 200A. Therefore, the thermal dissipation structure 200A not only serves as a thermal dissipation mechanism, but is also able to provide storage of capacitance. Therefore, with the presence of the thermal dissipation structure 200A, the overall electrical performance of the package structure 20 may be further enhanced.

Figure 3A:
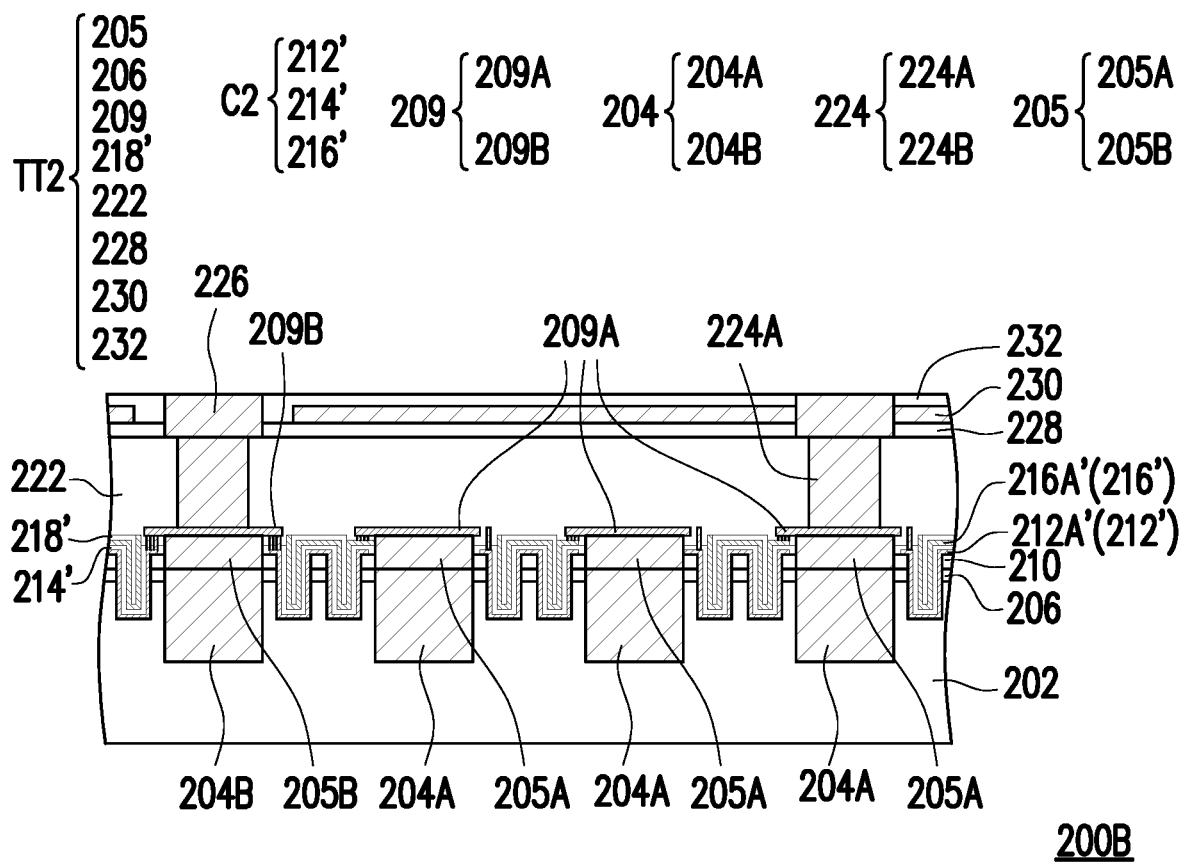
FIG. 3A is a schematic cross-sectional view of a thermal dissipation structure in accordance with some alternative embodiments of the disclosure.
Figure 3B:
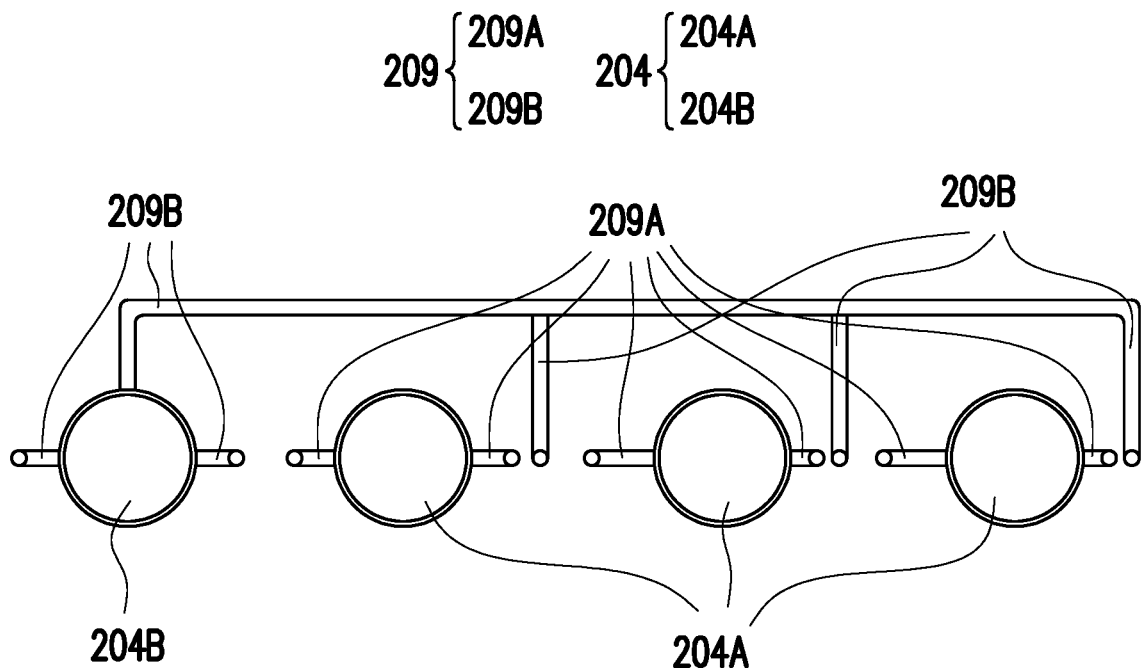
FIG. 3B is a schematic top view of the thermal dissipation structure in FIG. 3A.

FIG. 3A is a schematic cross-sectional view illustrating a thermal dissipation structure 200B in accordance with some alternative embodiments of the disclosure. FIG. 3B is a schematic top view illustrating the thermal dissipation structure 200B in FIG. 3A. It should be noted that for simplicity, elements other than the conductive vias 204 and the conductive patterns 209 are omitted in FIG. 3B. The thermal dissipation structure 200B in FIGS. 3A-3B is similar to the thermal dissipation structure 200A in FIG. 2L, so similar elements are denoted by the same reference numeral, and the detailed descriptions thereof are omitted herein. The difference between the thermal dissipation structure 200B in FIGS. 3A-3B and the thermal dissipation structure 200A in FIG. 2L lies in that in the thermal dissipation structure 200B of FIGS. 3A-3B, the conductive layer 212' and the conductive layer 216' of the capacitors C2 are physically isolated from the bonding vias 224. In addition, a plurality of conductive patterns 205 and a plurality of conductive patterns 209 are formed on the conductive vias 204. Furthermore, there are one second conductive vias 204B and three first conductive vias 204A instead of two second conductive vias 204B and two first conductive vias 204A, and there are two bonding vias 224 and two bonding pads 226 instead of four bonding vias 224 and four bonding pads 226. As illustrated in FIG. 3A, the conductive vias 204 are electrically connected to the capacitors C2 through the conductive patterns 209 and the conductive patterns 205. A formation method and a material of the conductive patterns 205 and the conductive patterns 209 are respectively similar to those of the conductive plane 208 in FIG. 1C, so the detailed descriptions thereof are omitted herein.

In some embodiments, the conductive patterns 205 include first conductive patterns 205A and a second conductive pattern 205B. The first conductive patterns 205A are disposed on and in physical contact with the first conductive vias 204A. Meanwhile, the second conductive pattern 205B is disposed on and in physical contact with the second conductive via 204B. In some embodiments, the conductive patterns 209 include first conductive patterns 209A and second conductive patterns 209B. The first conductive patterns 209A are connected to the first conductive vias 204A through the first conductive patterns 205A, and the second conductive patterns 209B are connected to the second conductive via 204B through the second conductive pattern 205B. In some embodiments, the first conductive patterns 209A are in physical contact with the conductive patterns 216A' of the conductive layer 216' such that electrical connection is established between the first conductive vias 204A and the conductive layer 216'. For example, as illustrated in FIG. 3B, the conductive patterns 209A branch out on two sides of the first conductive vias 204A. On the other hand, the second conductive patterns 209B are in physical contact with the conductive patterns 212A' of the conductive layer 212' such that electrical connection is established between the second conductive via 204B and the conductive layer 212'. For example, as illustrated in FIG. 3B, the conductive patterns 209B branch out from three sides of the second conductive via 204B. The conductive patterns 209B further branches out such the branches are disposed between adjacent first conductive vias 204A. In some embodiments, the conductive patterns 209A are connected to the conductive layer 216' on one side of the first conductive via 204A but are isolated from the conductive layer 216' on the other side of the first conductive via 204A. In some embodiments, the conductive patterns 209B are connected to the conductive layer 212' on both sides of the second conductive via 204B. It should be noted that thermal dissipation structure 200B may utilized in the aforementioned package structures 10 and 20, or may be utilized in the package structures that will be introduced below.

Figure 4:
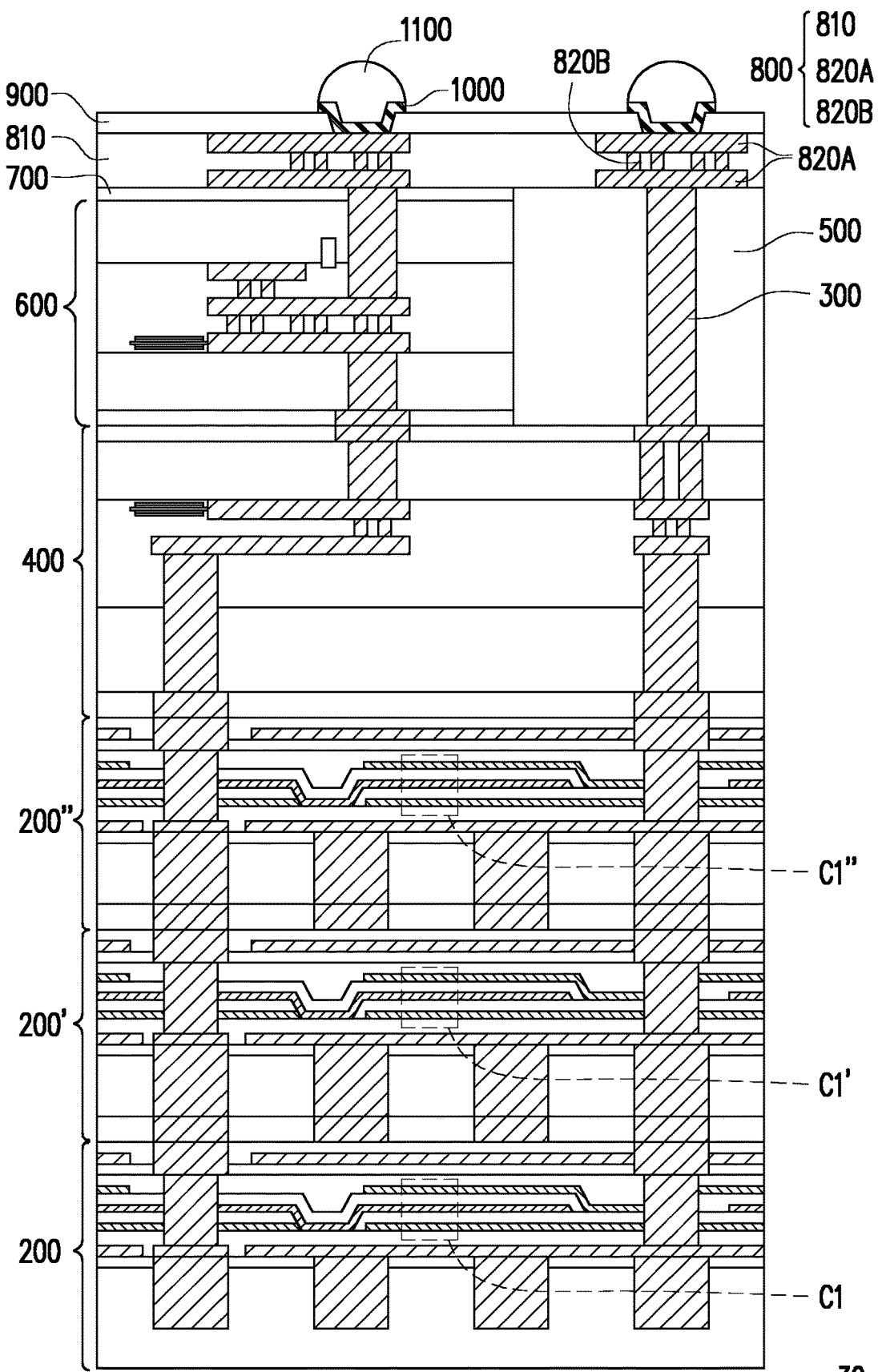
FIG. 4 is a schematic cross-sectional view of a package structure in accordance with some alternative embodiments of the disclosure.

FIG. 4 is a schematic cross-sectional view illustrating a package structure 30 in accordance with some alternative embodiments of the disclosure. In some embodiments, the package structure 30 in FIG. 4 is similar to the package structure 10 in FIG. 1R, so similar elements are denoted by the same reference numeral, and the detailed descriptions thereof are omitted herein. The difference between the package structure 30 in FIG. 4 and the package structure 10 in FIG. 1R lies in that the package structure 30 further includes a thermal dissipation structure 200' and a thermal dissipation structure 200". In some embodiments, the thermal dissipation structure 200' and the thermal dissipation structure 200" are similar to the thermal dissipation structure 200 in FIG. 1L, so the detailed descriptions thereof are omitted herein. As illustrated in FIG. 4, the thermal dissipation structure 200' and the thermal dissipation structure 200" are located between the thermal dissipation structure 200 and the semiconductor die 400. In some embodiments, the thermal dissipation structure 200' includes capacitors C1' embedded therein and the thermal dissipation structure 200" includes capacitors C1" embedded therein. In some embodiments, the thermal dissipation structures 200, 200', 200" provide a thermal dissipation solution for the semiconductor die 400 and the semiconductor die 600. For example, heat generated by the semiconductor die 400 and the semiconductor die 600 will respectively be dissipated out of the package structure 30 with the aid of the thermal dissipation structures 200, 200', 200". In other words, with the aid of the thermal dissipation structures 200, 200', 200", the thermal dissipation rate of the package structure 30 may be increased, and the performance of the package structure 30 may be enhanced. Furthermore, as mentioned above, capacitors C1, C1', and C1 "are respectively embedded in the thermal dissipation structures 200, 200', 200". Therefore, the thermal dissipation structures 200, 200', 200" not only serve as thermal dissipation mechanisms, but are also able to provide storage of capacitance. Therefore, with the presence of the thermal dissipation structures 200, 200', 200", the overall electrical performance of the package structure 30 may be further enhanced.

Figure 5:
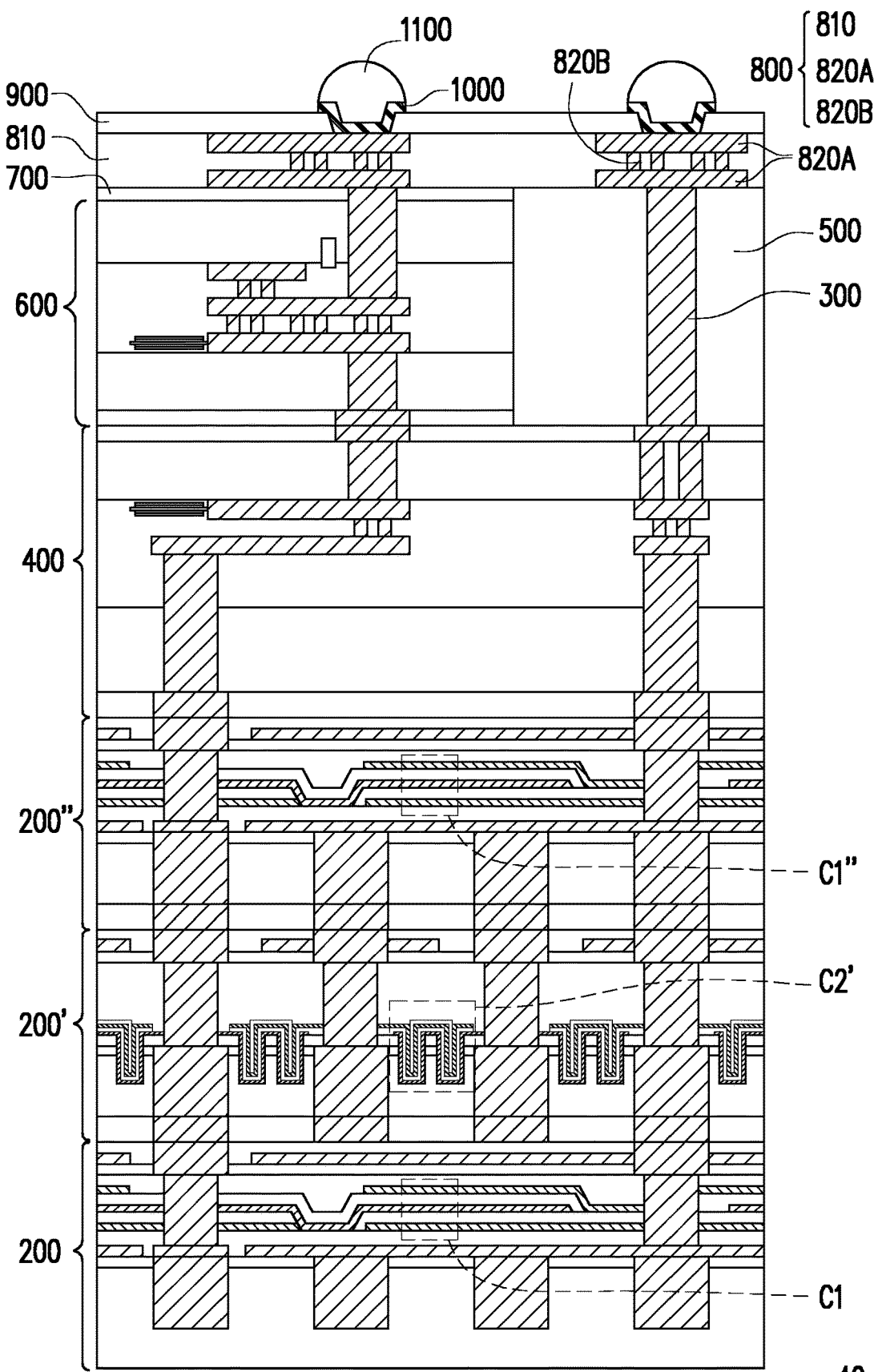
FIG. 5 is a schematic cross-sectional view of a package structure in accordance with some alternative embodiments of the disclosure.

FIG. 5 is a schematic cross-sectional view illustrating a package structure 40 in accordance with some alternative embodiments of the disclosure. In some embodiments, the package structure 40 in FIG. 5 is similar to the package structure 30 in FIG. 4, so similar elements are denoted by the same reference numeral, and the detailed descriptions thereof are omitted herein. The difference between the package structure 40 in FIG. 5 and the package structure 30 in FIG. 4 lies in that the package structure 40 includes thermal dissipation structure 200A' instead of the thermal dissipation structure 200'. In some embodiments, the thermal dissipation structure 200A' in FIG. 5 is similar to the thermal dissipation structure 200A in FIG. 2L, so the detailed descriptions thereof are omitted herein. As illustrated in FIG. 5, the thermal dissipation structure 200A' is located between the thermal dissipation structure 200 and the thermal dissipation structure 200". In some embodiments, the thermal dissipation structure 200A' includes capacitors C2' embedded therein, and the capacitors C2' in FIG. 5 are similar to the capacitor C2 in FIG. 2G, so the detailed descriptions thereof are omitted herein. In some embodiments, the thermal dissipation structures 200, 200A', 200" provide a thermal dissipation solution for the semiconductor die 400 and the semiconductor die 600. For example, heat generated by the semiconductor die 400 and the semiconductor die 600 will respectively be dissipated out of the package structure 40 with the aid of the thermal dissipation structures 200, 200A', 200". In other words, with the aid of the thermal dissipation structures 200, 200A', 200", the thermal dissipation rate of the package structure 40 may be increased, and the performance of the package structure 40 may be enhanced. Furthermore, as mentioned above, capacitors C1, C2', and C1" are respectively embedded in the thermal dissipation structures 200, 200A', 200". Therefore, the thermal dissipation structures 200, 200A', 200" not only serve as thermal dissipation mechanisms, but are also able to provide storage of capacitance. Therefore, with the presence of the thermal dissipation structures 200, 200A', 200", the overall electrical performance of the package structure 40 may be further enhanced.

Figure 6:
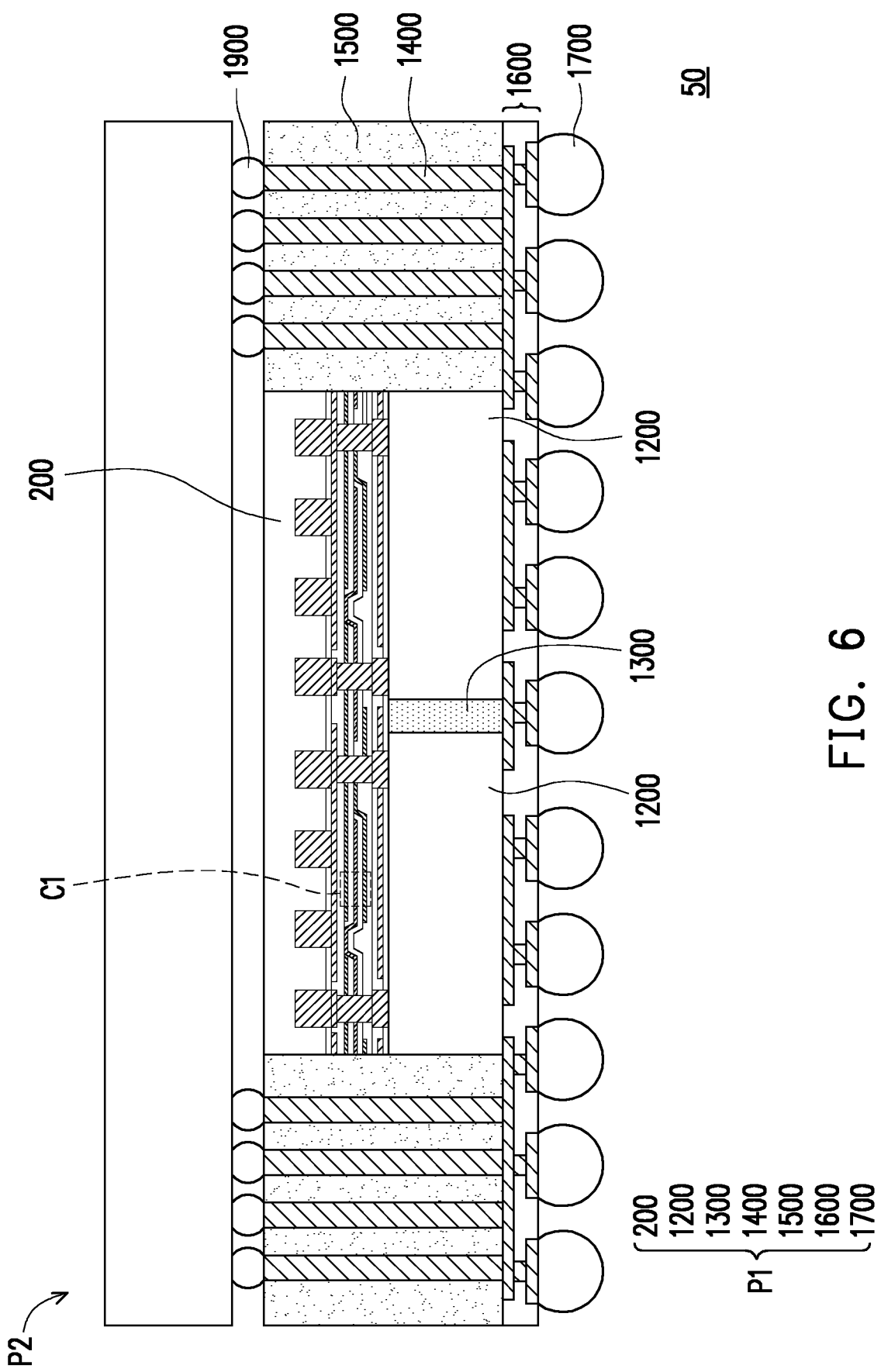
FIG. 6 is a schematic cross-sectional view of a package structure in accordance with some alternative embodiments of the disclosure.

FIG. 6 is a schematic cross-sectional view illustrating a package structure 50 in accordance with some alternative embodiments of the disclosure. In some embodiments, the package structure 50 includes a package P1 and a package P2. The package P1 includes the thermal dissipation structure 200, a plurality of dies 1200, a gap filling material 1300, a plurality of conductive structures 1400, an encapsulant 1500, a redistribution layer 1600, and a plurality of conductive terminals 1700. In some embodiments, the dies 1200 include logic dies, system on chip (SOC) dies, or other suitable semiconductor dies. For example, the dies 1200 may be Central Process Unit (CPU) dies, Graphic Process Unit (GPU) dies, Field-Programmable Gate Array (FPGA), or the like. In some embodiments, the thermal dissipation structure 200 is disposed on and attached to multiple dies 1200. In some embodiments, the thermal dissipation structure 200 in FIG. 6 is similar to the thermal dissipation structure in FIG. 1L, so the detailed description thereof is omitted herein. In some embodiments, gaps between adjacent dies 1200 are filled by the gap filling material 1300. In some embodiments, the gap filling material 1300 includes a molding compound, a molding underfill, a resin (such as epoxy), or the like. In some alternative embodiments, the gap filling material 1300 may include silicon oxide and/or silicon nitride. The dies 1200 and the thermal dissipation structure 200 are laterally encapsulated by the encapsulant 1500. In some embodiments, a material of the encapsulant 1500 may be the same as or different from the material of the gap filling material 1300. For example, the encapsulant 1500 may include a molding compound, a molding underfill, a resin (such as epoxy), or the like. The encapsulant 1500 may be formed by a molding process, such as a compression molding process.

As illustrated in FIG. 6, the conductive structures 1400 surround the dies 1200 and the thermal dissipation structure 200. Moreover, the conductive structures 1400 penetrate through the encapsulant 1500. In some embodiments, a material of the conductive structures 1400 includes aluminum, titanium, copper, nickel, tungsten, and/or alloys thereof. In some embodiments, the redistribution layer 1600 is disposed on the dies 1200 opposite to the thermal dissipation structure 200. Moreover, the conductive terminals 1700 are disposed on the redistribution structure 1600. In some embodiments, the redistribution structure 1600 and the conductive terminals 1700 in FIG. 6 are respectively similar to the redistribution structure 800 and the conductive terminals 1100 in FIG. 1R, so the detailed descriptions thereof are omitted herein. In some embodiments, the dies 1200 and the conductive structures 1400 are electrically connected to the redistribution structure 1600. In some embodiments, the package P1 is referred to as an "integrated fan-out (InFO) package structure."

In some embodiments, the package P1 may be further assembled with other packages to form a package structure. For example, as illustrated in FIG. 6, a package P2 is stacked on the package P1 to form the package structure 50. In some embodiments, the package P2 is electrically connected to the package P1 through a plurality of conductive terminals 1900. In some embodiments, the conductive terminals 1900 in FIG. 6 are similar to the conductive terminals 1100 in FIG. 1R, so the detailed descriptions thereof are omitted herein. In some embodiments, an underfill (not shown) may be optionally located between the package P1 and the package P2. In some embodiments, the underfill is able to protect the conductive terminals 1900 electrically connecting the packages P1 and P2. In some embodiments, the package structure 50 is referred to as a "package-on-package (PoP) structure."

In some embodiments, the thermal dissipation structure 200 provides a thermal dissipation solution for the dies 1200. For example, heat generated by the dies 1200 will respectively be dissipated out of the package structure 50 with the aid of the thermal dissipation structure 200. In other words, with the aid of the thermal dissipation structure 200, the thermal dissipation rate of the package structure 50 may be increased, and the performance of the package structure 50 may be enhanced. Furthermore, as mentioned above, capacitors C1 is embedded in the thermal dissipation structure 200. Therefore, the thermal dissipation structure 200 not only serves as a thermal dissipation mechanism, but is also able to provide storage of capacitance. Therefore, with the presence of the thermal dissipation structure 200, the overall electrical performance of the package structure 50 may be further enhanced.

Figure 7:
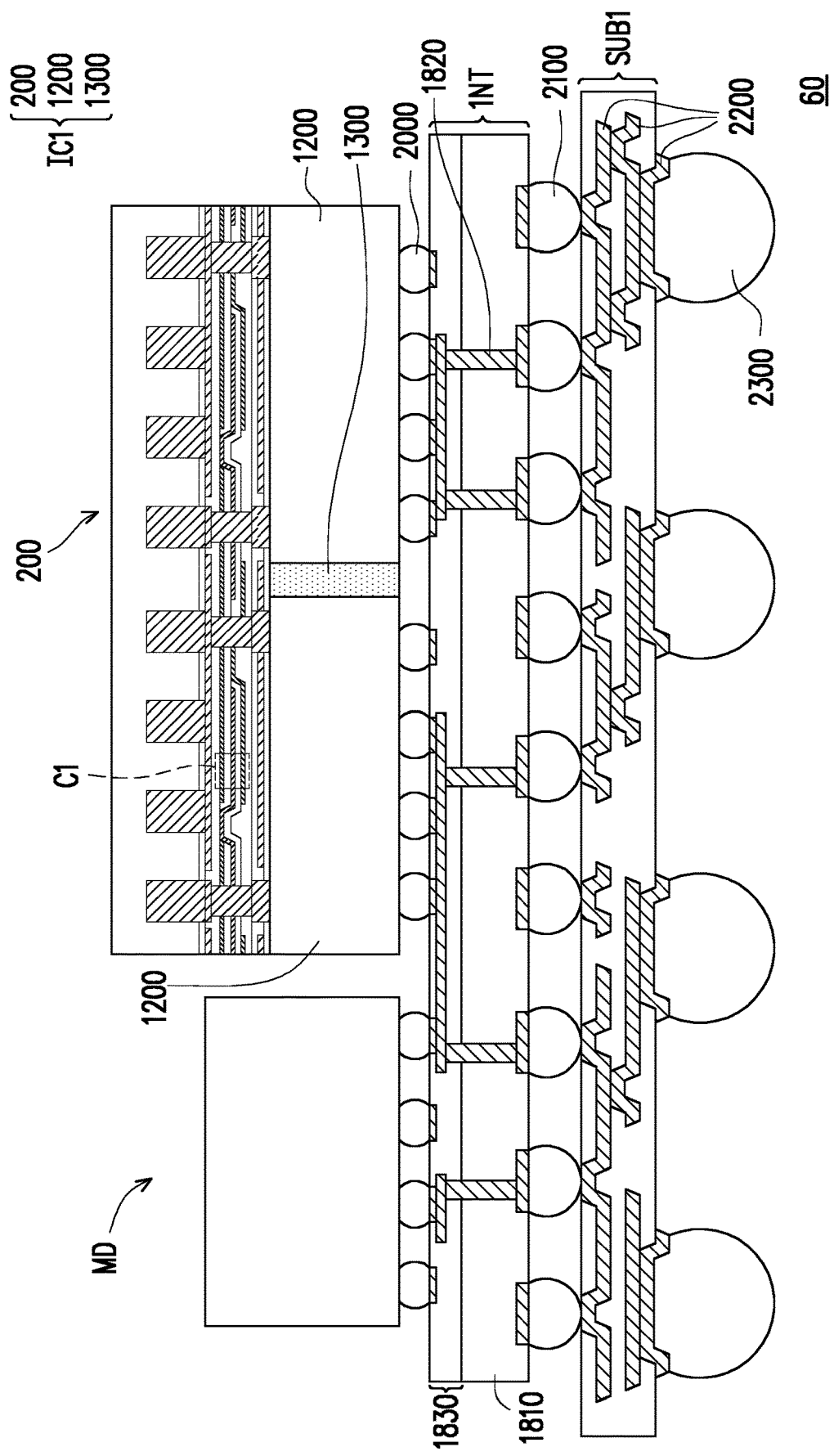
FIG. 7 is a schematic cross-sectional view of a package structure in accordance with some alternative embodiments of the disclosure.

FIG. 7 is a schematic cross-sectional view illustrating a package structure 60 in accordance with some alternative embodiments of the disclosure. Referring to FIG. 7, an integrated circuit IC1 and a memory device MD are bonded to an interposer INT. In some embodiments, the integrated circuit IC1 includes a plurality of dies 1200, a gap filling material 1300, and a thermal dissipation structure 200. In some embodiments, the dies 1200 include logic dies, SOC dies, or other suitable semiconductor dies. For example, the dies 1200 may be CPU dies, GPU dies, FPGA, or the like. In some embodiments, the thermal dissipation structure 200 is disposed on and attached to multiple dies 1200. In some embodiments, the thermal dissipation structure 200 in FIG. 7 is similar to the thermal dissipation structure in FIG. 1L, so the detailed description thereof is omitted herein. In some embodiments, gaps between adjacent dies 1200 are filled by the gap filling material 1300. In some embodiments, the gap filling material 1300 includes a molding compound, a molding underfill, a resin (such as epoxy), or the like. In some alternative embodiments, the gap filling material 1300 may include silicon oxide and/or silicon nitride. In some embodiments, the memory device MD includes high bandwidth memory (HBM) cubes or other suitable memory devices.

In some embodiments, the interposer INT includes a substrate 1810, a plurality of through vias 1820, and a redistribution structure 1830. In some embodiments, the substrate 1810 is a semiconductor substrate. For example, the substrate 1810 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the through vias 1820 penetrate through the substrate 1810. In some embodiments, the through vias 1820 are made of a conductive material. For example, the material of the through vias 1820 includes aluminum, titanium, copper, nickel, tungsten, and/or alloys thereof. The redistribution structure 1830 is disposed on the substrate 1810 and is electrically connected to the through vias 1820. In some embodiments, the redistribution structure 1830 includes a plurality of dielectric layers and a plurality of conductive pattern layers stacked alternately. The adjacent conductive patterns layers are electrically connected to each other through conductive vias sandwiched therebetween.

In some embodiments, the integrated circuit IC1 and the memory device MD are attached to the interposer INT through a flip-chip bonding process. For example, the integrated circuit IC1 and the memory device MD are bonded to the interposer INT through a plurality of conductive terminals 2000. In some embodiments, the conductive terminals 2000 in FIG. 7 are similar to the conductive terminals 1100 in FIG. 1R, so the detailed descriptions thereof are omitted herein.

In some embodiments, the interposer INT is mounted on a circuit substrate SUB1. In some embodiments, the circuit substrate SUB1 includes a printed circuit board (PCB) or the like. In some embodiments, the interposer INT is attached to the circuit substrate SUB1 through a plurality of conductive terminals 2100. On the other hand, a plurality of conductive terminals 2300 is formed on the circuit substrate SUB1 opposite to the interposer INT. The conductive terminals 2100 and the conductive terminals 2200 in FIG. 7 are similar to the conductive terminals 1100 in FIG. 1R, so the detailed descriptions thereof are omitted herein. In some embodiments, the circuit substrate SUB1 includes a plurality of conductive patterns 2200 embedded therein to transmit electrical signal. In some embodiments, the material of the conductive patterns 2200 includes aluminum, titanium, copper, nickel, tungsten, or alloys thereof. In some embodiments, the package structure 60 is referred to as a "chip-on-wafer-on-substrate (Co WoS) package structure."

In some embodiments, the thermal dissipation structure 200 provides a thermal dissipation solution for the dies 1200. For example, heat generated by the dies 1200 will respectively be dissipated out of the package structure 60 with the aid of the thermal dissipation structure 200. In other words, with the aid of the thermal dissipation structure 200, the thermal dissipation rate of the package structure 60 may be increased, and the performance of the package structure 60 may be enhanced. Furthermore, as mentioned above, capacitors C1 is embedded in the thermal dissipation structure 200. Therefore, the thermal dissipation structure 200 not only serves as a thermal dissipation mechanism, but is also able to provide storage of capacitance. Therefore, with the presence of the thermal dissipation structure 200, the overall electrical performance of the package structure 60 may be further enhanced.

Figure 8:
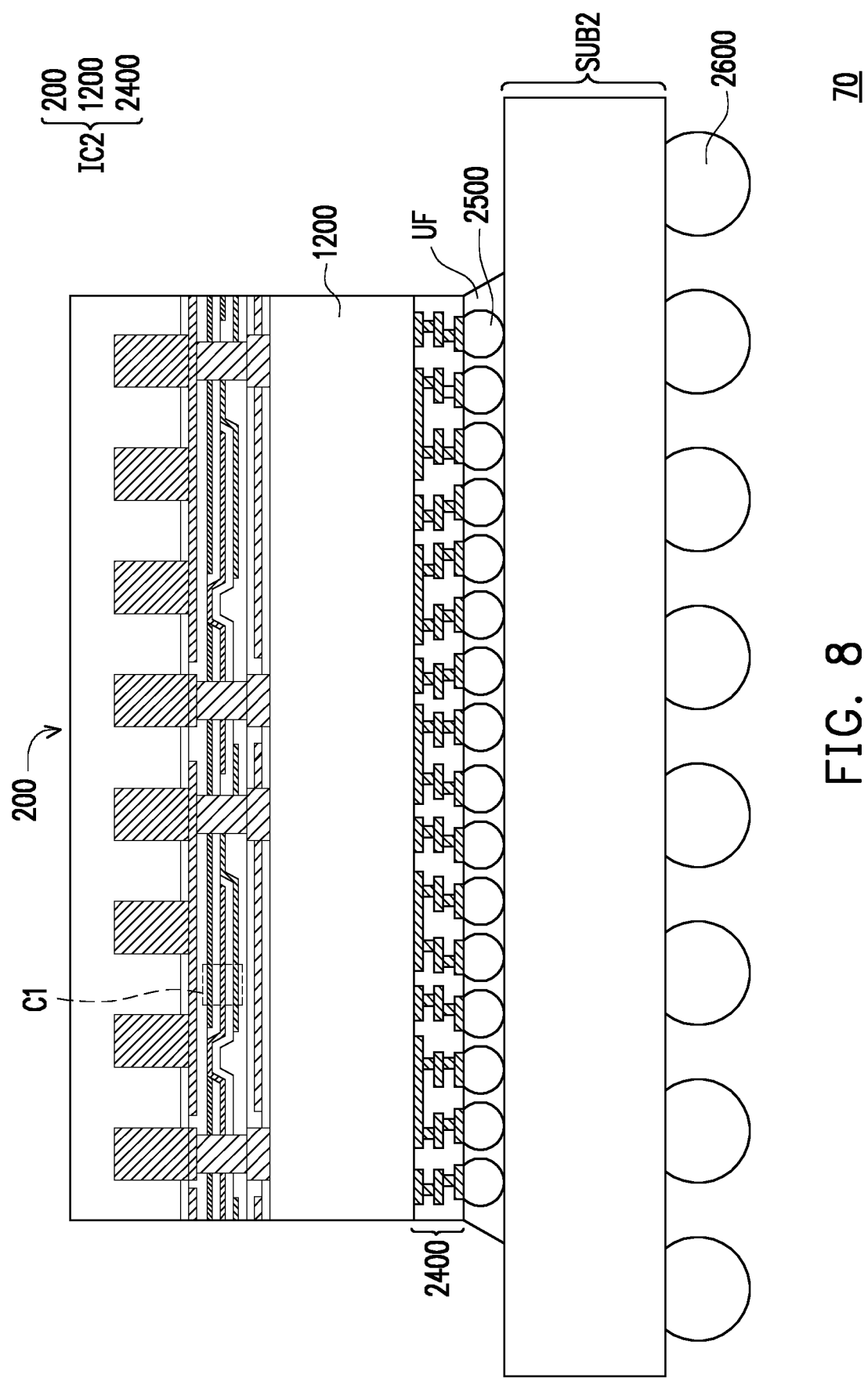
FIG. 8 is a schematic cross-sectional view of a package structure in accordance with some alternative embodiments of the disclosure.

FIG. 8 is a schematic cross-sectional view illustrating a package structure 70 in accordance with some alternative embodiments of the disclosure. Referring to FIG. 8, an integrated circuit IC2 is disposed on a circuit substrate SUB2. In some embodiments, the integrated circuit IC21 includes a die 1200, a thermal dissipation structure 200, and redistribution structure 2400. In some embodiments, the die 1200 includes a logic die, a SOC die, or other suitable semiconductor dies. For example, the die 1200 may be a CPU die, a GPU die, a FPGA, or the like. In some embodiments, the thermal dissipation structure 200 is attached to die 1200. In some embodiments, the thermal dissipation structure 200 in FIG. 8 is similar to the thermal dissipation structure in FIG. 1L, so the detailed description thereof is omitted herein. In some embodiments, the redistribution structure 2400 is disposed on the die 1200. In some embodiments, the redistribution structure 2400 in FIG. 8 is similar to the redistribution structure 800 in FIG. 1R, so the detailed descriptions thereof are omitted herein. As illustrated in FIG.

8, the thermal dissipation structure 200 and the redistribution structure 2400 are located on two opposite sides of the die 1200.

In some embodiments, the integrated circuit IC2 is attached to the circuit substrate SUB2 through a flip-chip bonding process. For example, the integrated circuit IC2 is bonded to the circuit substrate SUB2 through a plurality of conductive terminals 2500. In some embodiments, the conductive terminals 2500 in FIG. 8 are similar to the conductive terminals 1100 in FIG. 1R, so the detailed descriptions thereof are omitted herein. In some embodiments, an underfill UF is disposed between the integrated circuit IC2 and the circuit substrate SUB2. In some embodiments, the underfill UF is able to protect the conductive terminals 2500 electrically connecting the integrated circuit IC2 and the circuit substrate SUB2. In some embodiments, the circuit substrate SUB2 in FIG. 8 in similar to the circuit substrate SUB1 in FIG. 7, so the detailed description thereof is omitted herein. In some embodiments, the package structure 70 further includes a plurality of conductive terminals 2600 formed on the circuit substrate SUB2 opposite to the integrated circuit IC2. In some embodiments, the conductive terminals 2600 in FIG. 8 are similar to the conductive terminals 1100 in FIG. 1R, so the detailed descriptions thereof are omitted herein. In some embodiments, the package structure 70 is referred to as a "flip-chip package structure."

In some embodiments, the thermal dissipation structure 200 provides a thermal dissipation solution for the dies 1200. For example, heat generated by the dies 1200 will respectively be dissipated out of the package structure 70 with the aid of the thermal dissipation structure 200. In other words, with the aid of the thermal dissipation structure 200, the thermal dissipation rate of the package structure 70 may be increased, and the performance of the package structure 70 may be enhanced. Furthermore, as mentioned above, capacitors C1 is embedded in the thermal dissipation structure 200. Therefore, the thermal dissipation structure 200 not only serves as a thermal dissipation mechanism, but is also able to provide storage of capacitance. Therefore, with the presence of the thermal dissipation structure 200, the overall electrical performance of the package structure 70 may be further enhanced.

In accordance with some embodiments of the disclosure, a package structure includes a first thermal dissipation structure, a first semiconductor die, and a second semiconductor die. The first thermal dissipation structure includes a semiconductor substrate, conductive vias embedded in the semiconductor substrate, first capacitors electrically connected to the conductive vias, and a thermal transmission structure disposed over the semiconductor substrate and the conductive vias. The first semiconductor die is disposed on the first thermal dissipation structure. The second semiconductor die is disposed on the first semiconductor die opposite to the first thermal dissipation structure.

In accordance with some alternative embodiments of the disclosure, a package structure includes a thermal dissipation structure, a first semiconductor die, and a second semiconductor die. The thermal dissipation structure includes a semiconductor substrate, conductive vias embedded in the semiconductor substrate, a thermal transmission structure disposed on the semiconductor substrate and the conductive vias, bonding pads and bonding vias embedded in the thermal transmission structure, and capacitors embedded in the thermal transmission structure and located aside of the bonding vias. The bonding vias are located between the conductive vias and the bonding pads. The first semiconductor die has a first bonding layer on a first side and a second bonding layer on a second side opposite to the first side. The first bonding layer is hybrid bonded to the bonding pads of the thermal dissipation structure. The second semiconductor die has a third bonding layer. The third bonding layer of the second semiconductor die is hybrid bonded to the second bonding layer of the first semiconductor die.

In accordance with some embodiments of the disclosure, a manufacturing method of a package structure includes at least the following steps. A thermal dissipation structure is formed. The step of forming the thermal dissipation structure includes at least the following steps. A semiconductor substrate having first conductive vias and second conductive vias embedded therein is provided. Capacitors are formed over the semiconductor substrate. The capacitors are electrically connected to the first conductive vias and the second conductive vias. First bonding vias are formed over the first conductive vias and second bonding vias are formed over the second conductive vias. Bonding pads are formed on the first bonding vias and the second bonding vias. Subsequently, a first semiconductor die is hybrid bonded to the bonding pads of the thermal dissipation structure. Then, a second semiconductor die is hybrid bonded to the first semiconductor die opposite to the thermal dissipation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first thermal dissipation structure, comprising:
   a semiconductor substrate;
   conductive vias embedded in the semiconductor substrate;
   first capacitors electrically connected to the conductive vias;
   a thermal transmission structure disposed over the semiconductor substrate and the conductive vias, wherein the thermal transmission structure comprises a conductive plane; and
   bonding pads and bonding vias embedded in the thermal transmission structure, wherein the bonding vias electrically connect the conductive vias and the bonding pads, and the conductive plane is in physical contact with sidewalls of at least one of the bonding pads;
   a first semiconductor die disposed on the first thermal dissipation structure; and
   a second semiconductor die disposed on the first semiconductor die opposite to the first thermal dissipation structure.

2. The package structure of claim 1, wherein the first capacitors are embedded in the thermal transmission structure.

3. The package structure of claim 2, wherein the bonding vias are in physical contact with the first capacitors to electrically connect the conductive vias and the first capacitors.

4. The package structure of claim 1, wherein each of the first capacitors is partially embedded in the semiconductor substrate.

5. The package structure of claim 4, wherein the thermal transmission structure comprises conductive patterns, and the first capacitors are electrically connected to the conductive vias through the conductive patterns.

6. The package structure of claim 1, further comprising a second thermal dissipation structure disposed between the first thermal dissipation structure and the first semiconductor die, wherein the second thermal dissipation structure comprises second capacitors embedded therein.

7. The package structure of claim 1, wherein the semiconductor substrate of the first thermal dissipation structure is free of active components.

8. A package structure, comprising:
a thermal dissipation structure, comprising:
a semiconductor substrate;
conductive vias embedded in the semiconductor substrate;
a thermal transmission structure disposed on the semiconductor substrate and the conductive vias, wherein the thermal transmission structure comprises a conductive plane;
bonding pads and bonding vias embedded in the thermal transmission structure, wherein the bonding vias are located between the conductive vias and the bonding pads, and the conductive plane is in physical contact with sidewalls of at least one of the bonding pads; and
capacitors embedded in the thermal transmission structure and located aside of the bonding vias;
a first semiconductor die having a first bonding layer on a first side and a second bonding layer on a second side opposite to the first side, wherein the first bonding layer is hybrid bonded to the bonding pads of the thermal dissipation structure; and
a second semiconductor die having a third bonding layer, wherein the third bonding layer of the second semiconductor die is hybrid bonded to the second bonding layer of the first semiconductor die.

9. The package structure of claim 8, wherein the bonding vias comprises a first bonding via electrically connected to a ground voltage and a second bonding via electrically connected to a voltage different from the ground voltage.

10. The package structure of claim 9, wherein each capacitor comprises:
a first conductive pattern connected to the first bonding via;
a second conductive pattern connected to the second bonding via;
a first insulating layer sandwiched between the first conductive pattern and the second conductive pattern;
a third conductive pattern connected to the first bonding via; and
a second insulating layer sandwiched between the second conductive pattern and the third conductive pattern.

11. The package structure of claim 10, wherein the first conductive pattern and the third conductive pattern are in physical contact with a sidewall of the first bonding via, and the second conductive pattern is in physical contact with a sidewall of the second bonding via.

12. The package structure of claim 8, further comprising:
an encapsulant disposed on the first semiconductor die to laterally encapsulate the second semiconductor die;
a redistribution structure disposed on the second semiconductor die opposite to the third bonding layer; and
conductive terminals disposed on the redistribution structure.

13. The package structure of claim 12, further comprising a through insulating via (TIV) penetrating through the encapsulant to electrically connect the second bonding layer of the first semiconductor die and the redistribution structure.

14. The package structure of claim 8, wherein the semiconductor substrate of the thermal dissipation structure is free of active components and passive components.

15. A manufacturing method of a package structure, comprising:
forming a thermal dissipation structure, comprising:
providing a semiconductor substrate having first conductive vias and second conductive vias embedded therein;
forming capacitors over the semiconductor substrate, wherein the capacitors are electrically connected to the first conductive vias and the second conductive vias;
forming a thermal transmission structure over the semiconductor substrate, the first conductive vias, and the second conductive vias, wherein the thermal transmission structure comprises a first conductive plane;
forming first bonding vias over the first conductive vias and second bonding vias over the second conductive vias; and
forming bonding pads on the first bonding vias and the second bonding vias, wherein the first conductive plane is in physical contact with sidewalls of at least one of the bonding pads;
hybrid bonding a first semiconductor die to the bonding pads of the thermal dissipation structure; and
hybrid bonding a second semiconductor die to the first semiconductor die opposite to the thermal dissipation structure.

16. The method of claim 15, wherein the first conductive vias and the first bonding via are electrically connected to a ground voltage, and the second conductive vias and the second bonding via are electrically connected to a voltage different from the ground voltage.

17. The method of claim 16, wherein forming the capacitors comprises:
forming a first conductive pattern over the first conductive vias and the second conductive vias;
forming a first insulating layer to cover the first conductive pattern;
forming a second conductive pattern on the first insulating layer;
forming a second insulating layer to cover the second conductive pattern;
forming a third conductive pattern on the second insulating layer;
removing a portion of the first insulating layer and the second insulating layer to form openings exposing a second conductive plane located on the first conductive vias and the second conductive vias; and
filling the openings with a conductive material to form the first bonding vias over the first conductive vias and the second bonding vias over the second conductive vias, wherein the first conductive pattern and the third conductive pattern are in physical contact with the first bonding vias and the second conductive pattern is in physical contact with the second bonding vias.

18. The method of claim 16, wherein forming the capacitors comprises:

removing a portion of the semiconductor substrate to form trenches between adjacent conductive vias;

forming a first conductive pattern over the semiconductor substrate, wherein the first conductive pattern extends into the trenches;

forming a first insulating layer on the first conductive pattern to partially cover the first conductive pattern; and forming a second conductive pattern on the first insulating layer, wherein the second conductive pattern extends into the trenches.

19. The method of claim 15, further comprising:

laterally encapsulating the second semiconductor die by an encapsulant; and forming a redistribution structure on the encapsulant and the second semiconductor die.

20. The method of claim 19, further comprising forming a through insulating via (TIV) penetrating through the encapsulant to electrically connect the first semiconductor die and the redistribution structure.

* * * * *